(12) United States Patent
Haraguchi

(10) Patent No.: US 7,044,182 B2
(45) Date of Patent: May 16, 2006

(54) BONDING APPARATUS WITH POSITION DEVIATION CORRECTION

(75) Inventor: Manabu Haraguchi, Yokohama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/860,763

(22) Filed: Jun. 3, 2004

(65) Prior Publication Data

US 2004/0261947 A1    Dec. 30, 2004

(30) Foreign Application Priority Data

Jun. 5, 2003  (JP)  ............................. 2003-161157
Feb. 18, 2004  (JP)  ............................. 2004-041827

(51) Int. Cl.
*B32B 41/00* (2006.01)

(52) U.S. Cl. ...................... 156/351; 156/358; 156/362; 156/378

(58) Field of Classification Search ................ 156/378, 156/362, 351, 64, 358; 29/740, 741, 742, 29/743, 833, 834; 700/254; 702/95
See application file for complete search history.

(56) References Cited

U.S. PATENT DOCUMENTS 6,449,516 B1 *  9/2002  Kyomasu et al. ............. 700/58

6,464,126 B1 *  10/2002  Hayata et al. ............... 228/105
2001/0042770 A1 *  11/2001  Hayata et al. ............... 228/4.1
2004/0026006 A1 *  2/2004  Arai et al. ..................... 156/64

FOREIGN PATENT DOCUMENTS

| JP | 2-244649 | | 9/1990 |
|---|---|---|---|
| JP | 05-37196 | * | 2/1993 |
| JP | 7-7028 | | 1/1995 |
| JP | 2001-176934 | | 6/2001 |
| WO | WO 02/25720 A1 | * | 3/2002 |

* cited by examiner

*Primary Examiner*—George Koch
(74) *Attorney, Agent, or Firm*—Koda & Androlia

(57) ABSTRACT

A bonding apparatus that makes correction $\Delta X=(Xn-Xc)$ in positioning of bonding tool and substrate where the imaging center of first camera shows deviation $+Xc$ with respect to the imaging center of second camera, and deviation $+Xn$ occurs when bonding tool moves from height $Z1$ to height $Z2$. A target is disposed at height $Z1$ in a correcting position, and a correction camera is disposed beneath the target. The correction amount $\Delta X=(Xn-Xc)=X_3-(X_2+X_1)$ is determined based upon first positional deviation $X_1$ which is the position of a chip $10d$ at height $Z1$ seen from the target, second positional deviation $X_2$ which is the position of the target seen from the imaging center of the second camera, and third positional deviation $X3$ which is the position of the chip $10u$ at height $Z2$ seen from the imaging center of the first camera.

19 Claims, 15 Drawing Sheets

BONDING APPARATUS WITH POSITION DEVIATION CORRECTION

BACKGROUND OF THE INVENTION

1. Field of the Invention

The present invention relates to a bonding apparatus and more particularly to a bonding apparatus which has a positioning mechanism for aligning the position of a bonding tool and the position of a substrate.

2. Prior Art

In addition to wire bonding, face-down bonding is performed as a mounting method for connecting the bonding pads on chips such as LSI device, etc., and the bonding leads of substrates. Face-down bonding is a method in which the back surface side of the chip is held by the bonding tool, the front surface side of the held chip (i.e., the surface on the side on which electrode pads are disposed) and the wiring surface of the substrate are caused to face each other, the positions of the electrode pads on the chip and the positions of the bonding leads of the substrate are aligned, and these pads and leads are connected using thermal energy or ultrasonic energy. Flip-chip bonders and COF (chip on film) bonders, etc., are used as face-down bonding apparatuses.

In the positioning that is performed in face-down bonding, the electrode pads on the surface of the chip and the bonding leads on the surface of the substrate, which face each other, must be observed; accordingly, a chip position measurement camera and a substrate position measurement camera are used. For example, in cases where chips are mounted by lowering the bonding tool from above the substrate, a downward-facing camera which observes the area below from above is used as the substrate position measurement camera, and an upward-facing camera which observes the area above from below is used as the chip position measurement camera.

In one disposition method for the two cameras, the downward-facing camera can be disposed in a position that is higher than the height position of the substrate, and the upward-facing camera can be disposed separately from this in a position that is lower than the height position of the substrate.

In Japanese Patent Application Laid-Open (Kokai) No. 2001-176934, an optical device is disclosed in which a prism type mirror that has two reflective surfaces is used, and the light rays are split into the upward direction and downward direction from the prism type mirror, so that the surface of the chip and the surface of the substrate can be simultaneously observed. In this case this optical device can be disposed between the chip and the substrate. Regardless of the method that is adopted, in the example described above, the optical axis along which the chip is observed is oriented upward, and the optical axis along which the substrate is observed is oriented downward, so that these optical axes are separate optical axes. Accordingly, if there is a shift in these optical axes, this has an effect on positioning, and causes positional deviation in the bonding. For example, shifting of the optical axes may be caused by the effects of temperature elevation, etc., during the bonding work, or by a shift in the settings of the optical system, etc., resulting from changes that occur over time. The effects of such shifts in the optical axes on the positional deviation that occurs during bonding will be described below.

First, the ordinary positioning of the chip and substrate in cases where there is no shift in the optical axes is shown in FIG. 26. In order to simplify the description, only the positioning in the X direction shown in the figures will be considered. The chip 10 is held by the bonding tool 12, and the substrate 14 is held on a carrier 16. The bonding tool 12 and carrier 16 can be moved to arbitrary positions in the X direction by respective driving devices not shown in the drawings. The upper and lower cameras 20 used to observe the chip 10 and substrate 14 are disposed between the chip 10 and substrate 14; the position of the chip 10 can be measured by a first camera 26 which has an upward-oriented optical axis 22, and the position of the substrate 14 can be measured by a second camera 28 which has a downward-oriented optical axis 24. Furthermore, in the measurement of positions or distances between positions, it is necessary to consider the magnifications of the respective cameras. Below, however, unless otherwise noted, the system will be described with the distances between positions measured by the cameras calculated as actual distances, i.e., distances on the objective plane.

FIG. 26 shows a case in which the upward-oriented optical axis 22 and downward-oriented optical axis 24 are accurately aligned.

In this case, the center of the visual field of the first camera 26 and the center of the visual field of the second camera 28 coincide; accordingly, the reference position of the chip 10 and the reference position of the substrate 14 may be respectively aligned with these positions. Edge positions of the electrode pads on the chip 10 and edge positions of the corresponding bonding leads of the substrate 14 can be selected as the reference positions used for bonding. In FIG. 26, the upward-oriented optical axis 22 is assumed to be an axis that expresses the center position of the visual field of the first camera 26, and the downward-oriented optical axis 24 is assumed to be an axis that expresses the center position of the visual field of the second camera 28. It is assumed that when the positions of the chip 10 and substrate 14 were measured in this state, these positions were shifted as indicated by the broken line in FIG. 26. In this case, the carrier 16 is first moved until the reference position on the substrate 14 coincides with the downward-oriented optical axis 24 that expresses the center of the visual field of the second camera 28. Then, the bonding tool 12 is moved until the reference position on the chip 10 coincides with the upward-oriented optical axis 22 that expresses the center of the visual field of the first camera 26. In this way, the chip 10 and substrate 14 are positioned, and if there are no other factors involved, positional deviation does not occur in bonding.

If for some reason the upward-oriented optical axis 22 that expresses the center of the visual field of the first camera 26 and the downward-oriented optical axis 24 that expresses the center of the visual field of the second camera 28 are shifted, then the method shown in FIG. 26 is inadequate. Specifically, even if the reference position of the substrate 14 is caused to coincide with the downward-oriented optical axis 24 expressing the center of the visual field of the second camera 28, and the reference position of the chip 10 is caused to coincide with the upward-oriented optical axis 22 expressing the center of the visual field of the first camera 26, the chip 10 will not be bonded to the desired position on the substrate 14. FIG. 27 is a diagram showing a state in which the reference position of the substrate 14 is caused to coincide with the downward-oriented optical axis 24 expressing the center of the visual field of the second camera 28 in a case in which the optical axis 22 is shifted by +Xc with reference to the optical axis 24. Assuming that the chip 10 is in the position indicated by the broken line, then even if this is caused to coincide with the upward-oriented optical axis 22 expressing the center of the visual field of the second camera 28, the reference position of the chip 10 will be shifted by +Xc with respect to the reference position of the substrate 14.

Accordingly, in order to perform bonding in accurate positions with no positional deviation in bonding, it is necessary to measure by some method the amount of deviation +Xc of the optical axis 22 expressing the center of the visual field of the first camera 26 with reference to the optical axis 24 expressing the center of the visual field of the second camera 28. Then, even if there is a deviation between the optical axes of the two cameras, accurate bonding can be performed by aligning the reference position of the chip 10 with a position that is corrected by an amount −Xc with reference to the center of the visual field of the first camera 26.

In regard to methods used to measure the amount of deviation between the first camera and second camera, a method in which reference marks are respectively disposed on two surfaces or reference surfaces of different heights, alignment is accomplished by adjusting the positional relationship between these two reference marks of different heights beforehand, an this is used as a reference, is disclosed in Japanese Patent Application Publication (Kokoku) No. H6-28272 (corresponding to Japanese Patent Application Laid-Open (Kokai) No. H2-244649). More specifically, an optical device which can simultaneously observe the surface of the chip and the surface of the substrate is inserted between these two reference marks whose positional relationship has been arranged beforehand, and the amount of deviation between the first camera and second camera is measured.

Furthermore, Japanese Patent No. 2,780,000 (corresponding to Japanese Patent Application Laid-Open (Kokai) No. H7-7028) discloses that in a semiconductor positioning device which has a first recognition camera and a second recognition camera whose optical axes are oriented facing each other, a target which is disposed between the height of the first recognition camera and the height of the second recognition camera is used as a reference, and the variation of a reference position in the second recognition camera is detected. More specifically, the first recognition camera and second recognition camera with the target sandwiched in between are moved in relative terms so that these cameras can be positioned on the same axis, and the reference positions of the first recognition camera and second recognition camera are measured and stored in memory with the target as a reference. Next, ordinary bonding work is performed, and the variation in the reference positions of the two recognition cameras can be detected by again performing the same measurements as the preceding reference position measurements, and ascertaining if the measured positions have varied from the reference positions stored in memory.

As the tendency toward increased numbers of pins and increased density in chips and substrates has progressed, there has been a requirement for the disposition of chips on substrates with higher precision in face-down bonding apparatuses. In order to dispose chips on substrates with higher precision, it is necessary to reduce the positional deviation in bonding. Accordingly, it is necessary to detect the deviation between the two cameras with greater accuracy as described above.

Among conventional methods for detecting the deviation between the two cameras, the method of Japanese Patent Application Publication (Kokoku) No. H6-28272 requires two targets; furthermore, the work of adjusting and aligning the positional relationship between these targets is required, so that the construction is complicated, and the work takes time.

In the method of Japanese Patent No. 2,780,000, the focal positions of the recognition cameras must be restricted in order to accomplish accurate detection of the deviation. Specifically, in this method, it is necessary that both the focal position of the first recognition camera and the focal position of the second recognition camera be on the target during target recognition, and in the positioning for bonding, it is necessary that the focal position of the camera that recognizes the chip be on the chip, and that the focal position of the camera that recognizes the substrate be on the substrate. In this method, furthermore, bonding must be performed as follows: after the bonding tool is first disposed at the height of the substrate above the recognition camera and recognized, the bonding tool must be raised by a specified amount and moved over the substrate so that the substrate and chip do not collide at the side-surfaces; then, bonding must be performed by again lowering the bonding tool. Accordingly, there are cases in which the bonding speed is lowered by this vertical movement of the bonding tool.

Even assuming that the amount of deviation +Xc between the optical axis of the first camera and the optical axis of the second camera can be accurately measured and corrected, when the bonding work is performed, positional deviation in the bonding occurs in cases where the bonding tool does not move parallel to the optical axis to the bonding height on the substrate from the positioning height of the bonding tool, so that the chip cannot be accurately disposed on the substrate. Such conditions are shown in FIG. 28.

In FIG. 28, the upward-oriented optical axis 22 and the downward-oriented optical axis 24 are accurately aligned. In this case, if the bonding tool 12 moves parallel to the optical axis 22 from the height on the substrate to the height of the focal position of the first camera 26, it is sufficient to align the reference position of the substrate 14 with the center of the visual field of the second camera 28, and then to align the reference position of the chip 10 and the reference position of the substrate 14 with the center of the visual field of the first camera 26, as illustrated in FIG. 26. Now, let us assume that while the bonding tool 12 moves from the height on the substrate to the height of the focal position of the of the first camera 26, the position of the bonding tool 12 deviates by +Xn. In this case, even if the reference position of the substrate 14 is caused to coincide with the downward-oriented optical axis 24 expressing the center of the visual field of the second camera 28, and the reference position of the chip 10 is further caused to coincide with the upward-oriented optical axis 22 expressing the center of the visual field of the first camera 26, the chip 10 will be bonded not in the desired position on the substrate 14, but rather in a position shifted by −Xn on the substrate 14, so that positional deviation occurs in this bonding.

Accordingly, in order to dispose the chip 10 in an accurate position on the substrate 14, it is necessary to measure by some method the amount of deviation caused by the movement of the bonding tool 12, i.e., the amount +Xn by which the bonding tool is shifted while moving to the height of the focal position of the first camera 26, with the position at the height of the substrate as a reference. If this amount of deviation +Xn is measured, then positional deviation in bonding can be suppressed by aligning the reference position of the chip 10 with a position that is corrected by −Xn with reference to the center of the visual field of the first camera 26, so that the chip 10 can be disposed in an accurate position on the substrate 14.

In the methods of Japanese Patent Application Laid-Open (Kokai) No. 2001-176934 and Japanese Patent Application Publication (Kokoku) No. H6-28272, the amount of deviation arising from the movement of the bonding tool cannot be ascertained. Generally, however, the amount of deviation +Xn can be measured by performing trial bonding. Specifically, even if the amount of deviation +Xn is not known, the chip 10 will be shifted by −Xn on the substrate 14 as described above if bonding is performed with the reference position of the substrate 14 caused to coincide with the downward-oriented optical axis 24 expressing the center of the visual field of the second camera 28, and the reference position of the chip 10 further caused to coincide with the upward-oriented optical axis 22 expressing the center of the visual field of the first camera 26. Accordingly, if the sign of the amount of deviation detected by trial bonding is reversed, then the amount of deviation +Xn caused by the movement of the bonding tool can be determined.

However, what can be measured by trial bonding is the amount of deviation between the external shape on the side of the back surface of the chip and the substrate; the amount of deviation between the electrode pads on the chip and the bonding leads of the substrate cannot be accurately measured. Furthermore, when trial bonding is performed during the bonding work, there is a possibility of the waste of substrates and chips, and the performance of trial bonding off-line results in poor efficiency.

Thus, in the prior art, there are restrictions on the construction of the device used to measure the amount of deviation between the two cameras; furthermore, the amount of deviation caused by the movement of the bonding tool cannot be accurately measured. Accordingly, in the positioning of the chip and substrate in bonding, the more accurate correction of these amounts of deviation is difficult, so that the positional deviation in bonding cannot be further reduced.

SUMMARY OF THE INVENTION

One object of the present invention is to solve such problems encountered in the prior art and provide a bonding apparatus which can further reduce positional deviation in bonding.

Another object of the present invention is to provide a bonding apparatus which makes it possible to correct the amount of deviation caused by the movement of the bonding tool along with the amount of deviation between the two cameras used for positioning when the chip and substrate are positioned for bonding.

The above objects are accomplished by a unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a target which has a position reference and which can be observed from both sides thereof;

a correction camera which is disposed on one side of the target;

a first measurement means in which the object relating to the bonding tool is disposed on another side of the target in a predetermined positional relationship, the target and the object relating to the bonding tool are separately or simultaneously imaged by the correction camera, and a first positional deviation between the position reference of the target and a reference position of the object relating to the bonding tool is determined from image data of the correction camera;

a second measurement means in which the second camera is disposed on another side of the target in a predetermined positional relationship, the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and the positional deviation in bonding is corrected based upon calculation results of the calculating means.

In the above structure, it is preferable that the first measurement means determine the first positional deviation with the object relating to the bonding tool disposed at a height that is substantially the same as the height at which the substrate is disposed; and it is also preferable that the target be disposed at a height that is substantially the same as the height at which the substrate is disposed.

In the present invention, the correction camera, preferably, has an object-side telecentric optical system. The term "telecentric optical system" or "telecentric lens" refers to an optical system which is devised so that the principal light rays that are focused as an image pass through the rear side focal point of the lens. In such an optical system, it is known that the permissible range with respect to positional deviation in the direction facing the image focusing plane is broad, and that in particular, the size of the image, i.e., the distance from the optical axis, does not vary even if the object position fluctuates in the case of irradiation with transmitted light constituting parallel light.

The above objects are accomplished by another unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a target which has a position reference and which can be observed from both sides;

an optical part which is disposed on one side of the target and conducts an image of the target to the second camera;

a first measurement means in which the object relating to the bonding tool is disposed on another side of the target in a predetermined positional relationship, an image of the target conducted via the optical part and an image of the object relating to the bonding tool are separately or simultaneously acquired by the second camera, and a first positional deviation between the position reference of the target and a reference position of the object relating to the bonding tool is determined from image data of the second camera;

a second measurement means in which the second camera is disposed on another side of the target in a predetermined positional relationship, the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and the positional deviation in bonding is corrected based upon calculation results of the calculating means.

The above objects are accomplished by another unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a correction camera;

a first measurement means in which the object relating to the bonding tool is caused to face the correction camera in a predetermined positional relationship, the object relating to the bonding tool is imaged by the correction camera, and a first positional deviation between an imaging reference position of the correction camera and a reference position of the object relating to the bonding tool is determined from image data of the correction camera;

a second measurement means in which the second camera is caused to face the correction camera in a predetermined positional relationship, the imaging plane of the second camera is imaged by the correction camera, and a second positional deviation between the imaging reference position of the correction camera and an imaging reference position of the second camera is determined from image data of the correction camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and the imaging reference position of the first camera is determined from image data of the first camera; and a calculating means which determines a positional deviation in bonding based upon the first positional deviation, second positional deviation and third positional deviation; and the positional deviation in bonding is corrected based upon calculation results of the calculating means.

In the present invention, it is preferable that the first camera and second camera of the positioning mechanism be disposed on the same side of the target, that the positioning mechanism have a first camera and second camera which are disposed so that the object relating to the bonding tool and the substrate can be simultaneously observed, and that the bonding tool and second camera in the positioning mechanism be disposed at a specified distance from each other.

It is further preferable in the present invention that the bonding apparatus further includes a second camera magnification measurement means in which the second camera is disposed on another side of the target, the second camera is moved for a specified distance and a variation in the position of the target is imaged by the second camera, and a magnification of the second camera is determined from image data of the second camera based upon a variation in the position of the position reference of the target before and after the movement of the second camera.

It is further preferable in the present invention that the bonding apparatus further include a correction camera magnification measurement means in which the object relating to the bonding tool is caused to face the correction camera, the object relating to the bonding tool is moved for a specified distance and the variation in the position of the object relating to the bonding tool is imaged by the correction camera, and the magnification of the correction camera is determined from image data of the correction camera based upon the variation in the position of the object relating to the bonding tool before and after the movement of the object relating to the bonding tool.

It is also preferable in the present invention that the bonding apparatus further include:

a means for measuring a distance between two points in which the object relating to the bonding tool is caused to face the correction camera, the distance between two arbitrary points set on the object relating to the bonding tool is imaged by the correction camera, and the distance between the arbitrary two points is determined from image data of the correction camera using the magnification of the correction camera; and a first camera magnification measurement means in which the first camera is caused to face the object relating to the bonding tool, the distance between the arbitrary two points set on the object relating to the bonding tool is imaged by the first camera, and the magnification of the first camera is determined based upon image data of the first camera and the distance between the arbitrary two points determined by the means for measuring a distance between two points.

It is also preferable in the present invention that the bonding apparatus further include a second camera inclination measurement means in which the second camera is disposed on another side of the target, the second camera is moved in a specified direction and the variation in the position of the target is imaged, and an angle of inclination of the second camera with respect to the target is determined from image data of the second camera based upon the variation in the position reference of the target before and after the movement of the second camera.

It is also preferable in the present invention that the bonding apparatus further include:

a shape inclination measurement means in which the object relating to the bonding tool is caused to face the correction camera, the target and an arbitrary shape set on the object relating to the bonding tool are imaged by the correction camera, and an angle of inclination of the arbitrary shape with respect to the target is determined from image data of the correction camera; and a first camera inclination measurement means in which the first camera is caused to face the object relating to the bonding tool, the arbitrary shape set on the object relating to the bonding tool is imaged by the first camera, and an angle of inclination of the first camera with respect to the target is determined based upon image data of the first camera and an inclination of the arbitrary shape determined by the shape inclination measurement means.

The above objects are accomplished by still another unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a target;

a correction measurement device;

a first measurement means in which the target and the object relating to the bonding tool are separately or simultaneously measured by the correction measurement device, and a first positional deviation between a position reference of the target and a reference position of the object relating to the bonding tool is determined from the measurement data;

a second measurement means in which the target is imaged by the second camera, and a second positional deviation between the position reference of the target and an imaging reference position of the second camera is determined from image data of the second camera;

a third measurement means in which the object relating to the bonding tool is imaged by the first camera, and a third positional deviation between the reference position of the object relating to the bonding tool and an imaging reference position of the first camera is determined form the image data of the first camera; and a calculating means which determines a positional deviation in bonding based upon the first positional deviation, second positional deviation and third positional deviation; and the positional deviation in bonding is corrected based upon calculation results of the calculating means.

The above objects are accomplished by still another unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a target that can be observed from side-surface sides and upper-surface side thereof;

at least one correction camera which is disposed so that the side-surfaces of the target can be respectively observed from two directions;

a first measurement means in which the object relating to the bonding tool is disposed on upper-surface side of the target in a predetermined positional relationship, the target and the object relating to the bonding tool are separately or simultaneously imaged by the correction camera, and a first positional deviation between a position reference of the target and a reference position of the object relating to the bonding tool is determined from image data of the correction camera;

a second measurement means in which the second camera is disposed on an upper-surface side of the target in a predetermined positional relationship, the upper-surface of the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and the positional deviation in bonding is corrected based upon calculation results of the calculating means.

The above objects are accomplished by still another unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a target;

an optical part which conducts an image of the target to the second camera;

a first measurement means in which an image of the target conducted via the optical part and an image of the object relating to the bonding tool are separately or simultaneously imaged by the second camera, and a first positional deviation between a position reference of the target and a reference position of the object relating to the bonding tool is determined from image data of the second camera;

a second measurement means in which the target is imaged by the second camera, and a second positional deviation between the position reference of the target and an imaging reference position of the second camera is determined from image data of the second camera;

a third measurement means in which the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and the positional deviation in bonding is corrected based upon calculation results of the calculating means.

The above objects are accomplished by still another unique structure of the present invention for a bonding apparatus that includes a positioning mechanism which performs bonding by positioning by the positioning mechanism an object of bonding, which is held in a bonding tool, in a determined position of a substrate disposed on a bonding execution surface, the positioning mechanism being comprised of:

a first camera that measures a position of an object relating to the bonding tool by way of taking at least one of the bonding tool, the object of bonding held in the bonding tool and a measurement member held in the bonding tool as the object relating to the bonding tool; and a second camera that measures a position of the substrate; and in the present invention the positioning mechanism is further comprised of:

a target that can be observed from side-surface sides and an upper-surface side thereof;

optical parts which are disposed on side-surface sides of the target and which respectively conduct images of side-surfaces of the target from two directions to the second camera;

a first measurement means in which the object relating to the bonding tool is disposed on another side of the target in a predetermined positional relationship, images of the target conducted via the optical parts and an image of the object relating to the bonding tool are separately or simultaneously acquired by the second camera, and a first positional deviation between a position reference of the target and a reference position of the object relating to the bonding tool is determined from image data of the second camera;

a second measurement means in which the second camera is disposed on an upper-surface side of the target in a predetermined positional relationship, the upper-surface of the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and the positional deviation in bonding is corrected based upon calculation results of the calculating means.

In the present invention, it is preferable that the optical part be comprised of a first reflective means which reflects an image of the side-surface of the target from a first direction, a second reflective means which reflects an image of the side-surface of the target from the second direction, and a half-mirror which has both a reflective surface and a transmitting surface and which further reflects an image from the first reflective means by the reflective surface and transmits an image from the second reflective means by the transmitting surface; and that the first reflective means, second reflective means and half-mirror be disposed so that the optical axis of the reflected light following reflection and the optical axis of the transmitted light following transmission in the half-mirror are coaxial, and so that the length of the light path from the target to the reflective surface of the half-mirror for the image of the side-surface of the target from the first direction and the length of the light path from the target to the transmitting surface of the half-mirror for the image of the side-surface of the target from the second direction are substantially equal.

DETAILED DESCRIPTION OF THE INVENTION

The principle of the present invention will be first described.

More specifically, the principle of the present invention that makes it possible to achieve a further reduction in the positional deviation in bonding, and especially the principle which makes it possible to correct the amount of deviation caused by the movement of the bonding tool along with the amount of deviation between the two cameras used for positioning when the chip and substrate are positioned for bonding, will be described below.

Here, as in the description given in FIGS. 26 through 28, positioning in a single dimension, i.e., positioning in the X direction, will be described. However, the present invention can easily be applicable to two-dimensional positioning by replacing the one-dimensional vectors with two-dimensional vectors. Furthermore, as in the case of FIGS. 26 through 28, it is necessary to consider the magnifications of the respective cameras in the measurement of positions or distances between positions; however, in the following description as well, unless specifically noted otherwise, the system will be described with the distances between positions measured by the cameras calculated as actual distances, i.e., distances on the objective plane.

First, the amount of correction ΔX whereby the positioning of the chip an substrate must be corrected in order to eliminate the positional deviation in bonding in a case in which an amount of deviation caused by the movement of the bonding tool exists along with the amount of deviation between the two cameras used for positioning will be clarified.

Figure 26:
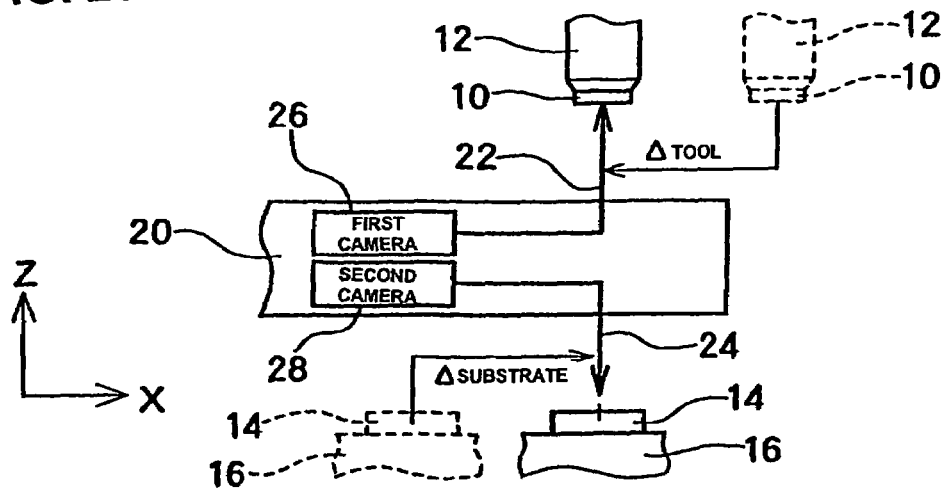
FIG. 26 is a diagram which illustrates the positioning of the chip and substrate in a case there is no deviation between the optical axes of the two cameras.
Figure 27:
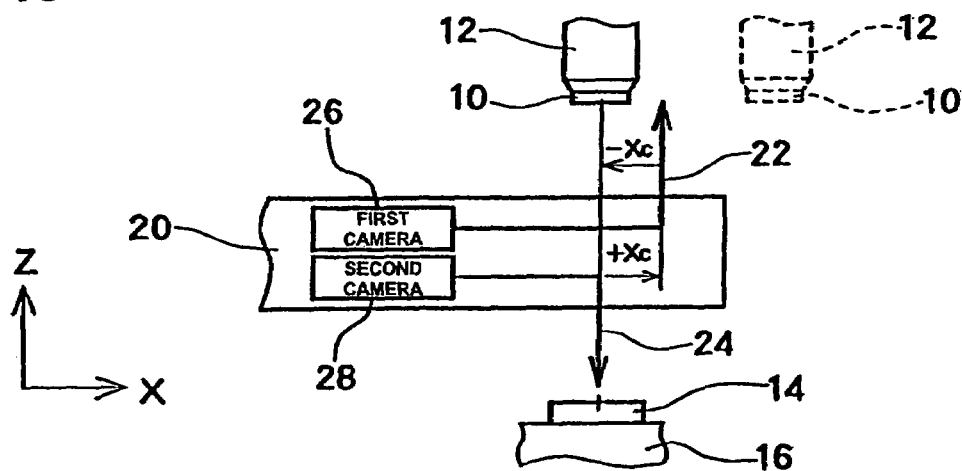
FIG. 27 is a diagram which illustrates the positioning of the chip and substrate in a case there is a deviation between the optical axes of the two cameras.
Figure 28:
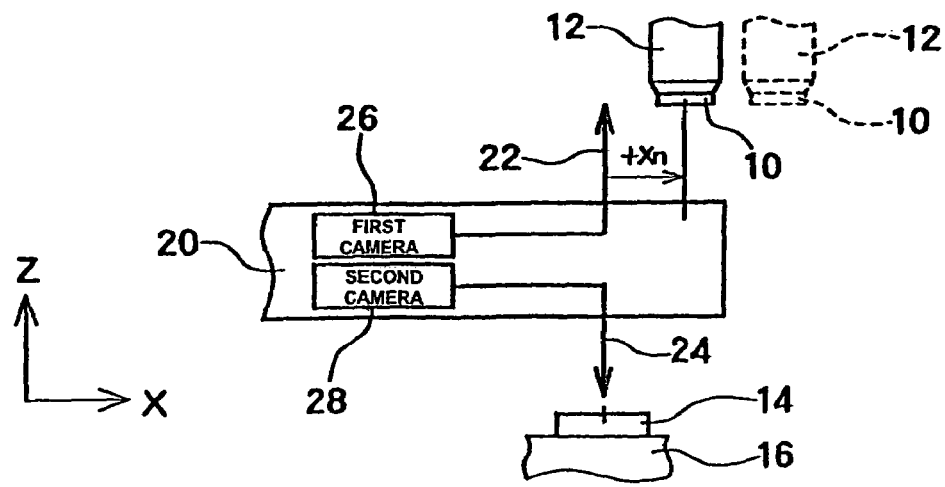
FIG. 28 is a diagram which illustrates the positioning of the chip and substrate in a case where there is no deviation between the optical axes of the two cameras, but a deviation does occur as a result of the movement of the bonding tool.

If the same coordinate system and symbols as those used in FIGS. 26 through 28 are used for the dispositions, amounts of correction and amounts of deviation of the respective elements, then the amount of correction for a deviation of +Xc between the two cameras is −Xc, and the amount of correction for a deviation +Xn arising from the movement of the bonding tool is −Xn, as described above. Furthermore, in cases where both of these amounts of deviation exist, as may be understood from the fact that the same conclusion is drawn both in cases where a deviation of +Xn caused by the movement of the bonding tool further occurs in FIG. 27, and in cases where an optical axis deviation of +Xc further occurs in FIG. 28, the amount of correction that is to be applied in such cases is (−Xc +Xn). Accordingly, in cases where an amount of deviation caused by the movement of the bonding tool exists along with the amount of deviation between the two cameras used for positioning, the correction amount ΔX for positioning that is required in order to eliminate positional deviation in bonding is given by the following Equation (1).

$$\Delta X = -Xc + Xn \quad (1)$$

In addition to the function of positioning the substrate and the chip held by the bonding tool, the bonding apparatus of the present invention also has a correction function that determines the amount of correction ΔX that is used to correct the positional deviation in bonding. Specifically, a correcting position which is used to determine the amount of correction ΔX is set separately from the positioning position in which positioning is performed. A target constituting a position reference for correction and a correction camera are disposed in the correcting position, and a first camera which measures the position of the chip, a second camera which measures the position of the substrate, and the bonding tool which holds the chip, can be moved into the correcting position.

Figure 1:
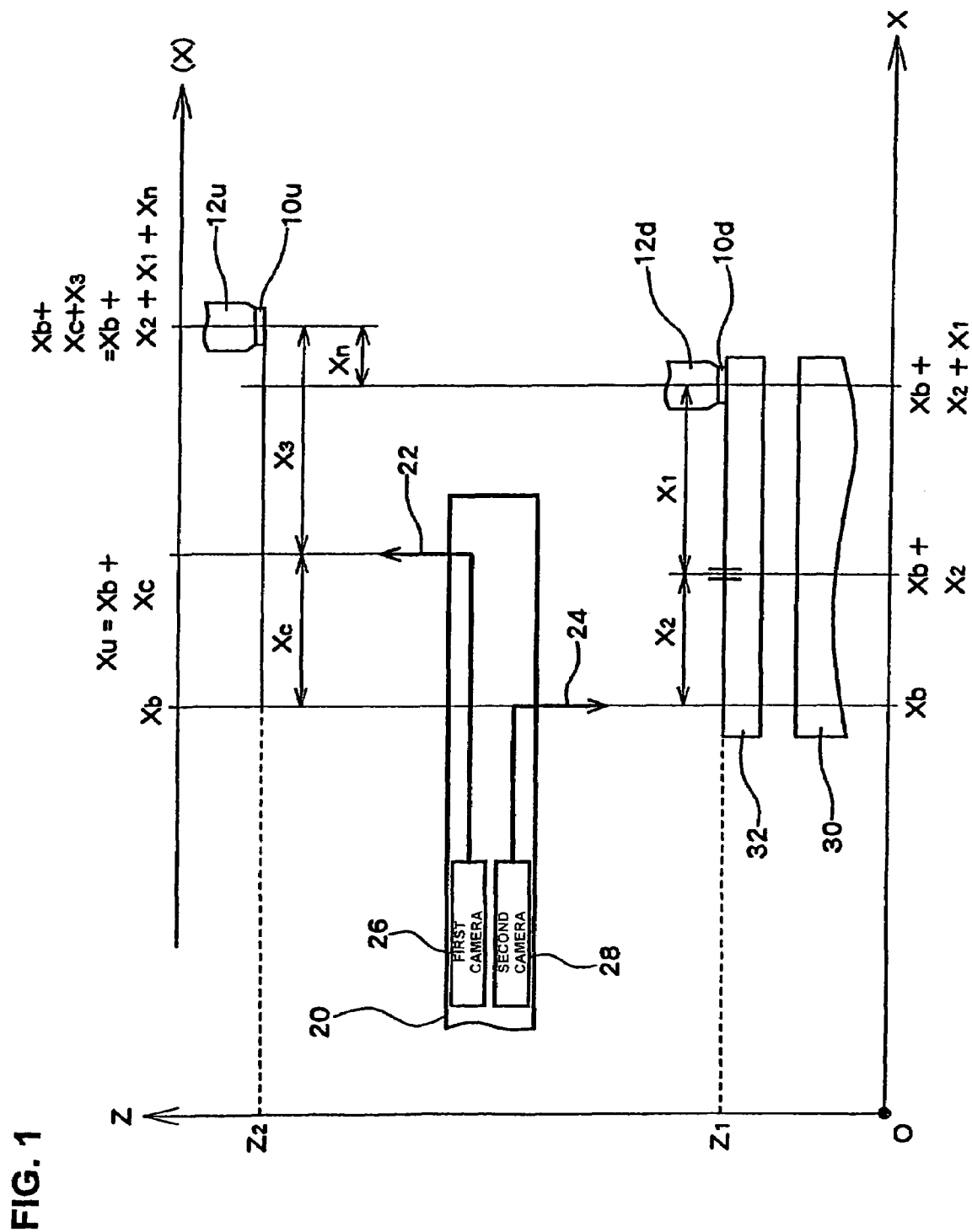
FIG. 1 is a diagram which illustrates the principle of the present invention.

FIG. 1 is a diagram which shows the positional relationship of the respective elements in the correcting position. The same symbols are assigned to elements that occur in common with FIGS. 26 through 28. In the coordinate system that is used, the plane parallel to the bonding surface on which bonding is performed is taken as the XY plane, the direction in which the bonding tool 12 moves vertically is taken as the Z direction perpendicular to the XY plane, and the X axis and Z axis are indicated. A correction camera 30 and a target 32 constituting a position reference used for correction are disposed in specified positions in the correcting position. The target 32 is disposed in a position Z1 at the same height as the bonding height of the substrate 14. The correction camera 30 is disposed facing upward beneath the target 32 with the target 32 as the focal position, so that this camera can observe the target 32.

Next, the operations of the respective elements use to determine the correction amount ΔX, and the positional relationship of these elements on the X axis, will be described. First, the bonding tool 12 is moved a specified distance from the positioning position (not shown in the drawings), and is thus moved into the correcting position. Furthermore, the bonding tool is pulled upward so that the height of the chip 10u held by the bonding tool 12u is set at the height Z2 of the focal position of the first camera 26. In this state, the first camera 26 and second camera 28 are moved as a set for a specified distance from the positioning position (not shown in the drawings), and are thus moved into the correcting position, the chip 10u at the height Z2 held by the bonding tool 12u is imaged by the first camera 26, and the target 32 is imaged by the second camera 28.

Here, the position of the optical axis 24 expressing the imaging center of the second camera 28 is designated as Xb, and the positional relationship of the respective elements on the X axis is expressed using this position as a reference. Now, if $X_2$ is taken as the distance to the center position of the target 32 as seen from the position (Xb) of the optical axis 24, then the center position of the target 32 is $Xb+X_2$. $X_2$ can be determined from the image data.

Furthermore, if Xc is taken as the distance from the optical axis 24 expressing the imaging center of the second camera 28 to the optical axis 22 expressing the imaging center of the first camera 26, then the position of the optical axis 22 expressing the imaging center of the first camera 26 is Xb+Xc. Moreover, if $X_3$ is taken as the distance to the reference position of the chip 10u at a height of Z2 as seen from the upward-oriented optical axis 22 expressing the imaging center of the first camera 26, then the reference position of the chip 10u at a height of Z2 is $Xb+Xc+X_3$. $X_3$ can be determined from the image data.

Next, if necessary, the first camera 26 and second camera 28 are appropriately withdrawn, the bonding tool 12 is lowered, and the height of the chip 10d held by the bonding tool 12d is set at the height Z1 of the target 32, i.e., at the same height as the height of the substrate 14. In this case, a positional deviation Xn caused by the movement of the bonding tool 12 in the direction of the Z axis is generated; in this state, the chip 10d held by the bonding tool 12d and the target 32 are imaged by the correction camera 30. Alternatively, the system may be devised so that the target 32 is made movable, only the chip 10d is set at the height Z1 and imaged, and only the target 32 is separately set at the height Z1 and imaged. If $X_1$ is taken as the distance to the reference position of the chip 10d at a height of Z1 as seen from the target center position $(Xb+X_2)$, then the reference position of the chip 10d at the height of Z1 is $Xb+X_2+X_1$. $X_1$ can be determined from the image data.

Here, if the positional deviation Xn arising from the movement of the bonding tool 12 is taken as distance to the reference position of the chip 10u at a height of Z2 as seen from the reference position $(Xb+X_2+X_1)$ of the chip 10d at a height of Z1, then the reference position of the chip 10u at a height of Z2 is $Xb+X_2+X_1+Xn$.

Since the reference position of the chip 10u at a height of Z2 obtained by the first camera 26 above is $Xb+Xc+X_3$, this is set equal to $Xb+X_2+X_1+Xn$, so that $Xb+Xc+X_3=Xb+X_2+X_1+Xn$, and furthermore, $Xc=X_2+X_1+Xn-X_3$. If the correction amount $\Delta X=-Xc+Xn$ is derived from this, then Equation (2) is obtained.

$$-Xc+Xn=\Delta X=X_3-(X_2+X_1) \quad (2)$$

Since $X_3$, $X_2$ and $X_1$ constituting the right-side components of Equation (2) are positional deviation amounts determined from the respective sets of image data, the correction amount $\Delta X=-Xc+Xn$ can be determined based upon the respective sets of image data. Thus, in the construction of the present invention, the necessary correction amount $\Delta X$ can be determined from the measurement of three positional deviation amounts, even if the deviation amount $+Xc$ of the two cameras and the deviation amount $+Xn$ arising from the movement of the bonding tool are not independently measured.

Furthermore, $X_3$, $X_2$ and $X_1$ can be determined from the image data of the respective cameras by using one position reference and a reference position on the bonding tool. Accordingly, there is no need to use two targets whose positional relationship has been adjusted and arranged in advance as in the prior art, and there are likewise no restrictions on the focal positions of the first camera and second camera with respect to the target.

Furthermore, in the measurement of $X1$, the values of $X_3$, $X_2$ and $X_1$ can be determined from the image data and Equation (2) can be calculated even if the height position of the bonding tool is not set at the height position $Z1$ of the substrate 14. As described above, since there are no restrictions on the apparatus (as in the prior art) in the determination of $X_3$, $X_2$ and $X_2$, correction can be performed more accurately in this case as well if the positioning correction is performed based upon the calculated value of Equation (2), so that the positional deviation in bonding can be further suppressed.

In this case, since there may be instances in which the correction that accompanies deviation caused by the movement of the bonding tool in the vertical direction is insufficient, it is more desirable to use trial bonding in combination with this correction. For example, the positioning is corrected based upon the correction amount determined by Equation (2), and in this corrected state, trial bonding is further performed so that the correction amount that accompanies the deviation caused by the movement of the bonding tool in the vertical correction following the above-described correction is separately determined. By using such trial bonding in combination, it is possible to suppress the positional deviation that occurs in bonding even further.

Embodiments of the present invention will be described in detail below with reference to the attached figures.

In the following description, the same symbols are assigned to elements that are the same as in FIGS. 26 through 28 and FIG. 1. Below, the bonding apparatus will be described as a flip-chip bonder in which an LSI chip that has bumps is bonded to a substrate by face-down bonding. However, the chip used may be a semiconductor element or electronic device other than an LSI chip, and the substrate used may be a glass-epoxy substrate or the like. Furthermore, the bonding apparatus may be a COF bonder in which a film substrate is used as the substrate, and chips are bonded to this substrate by face-down boning.

EMBODIMENT 1

Figure 2:
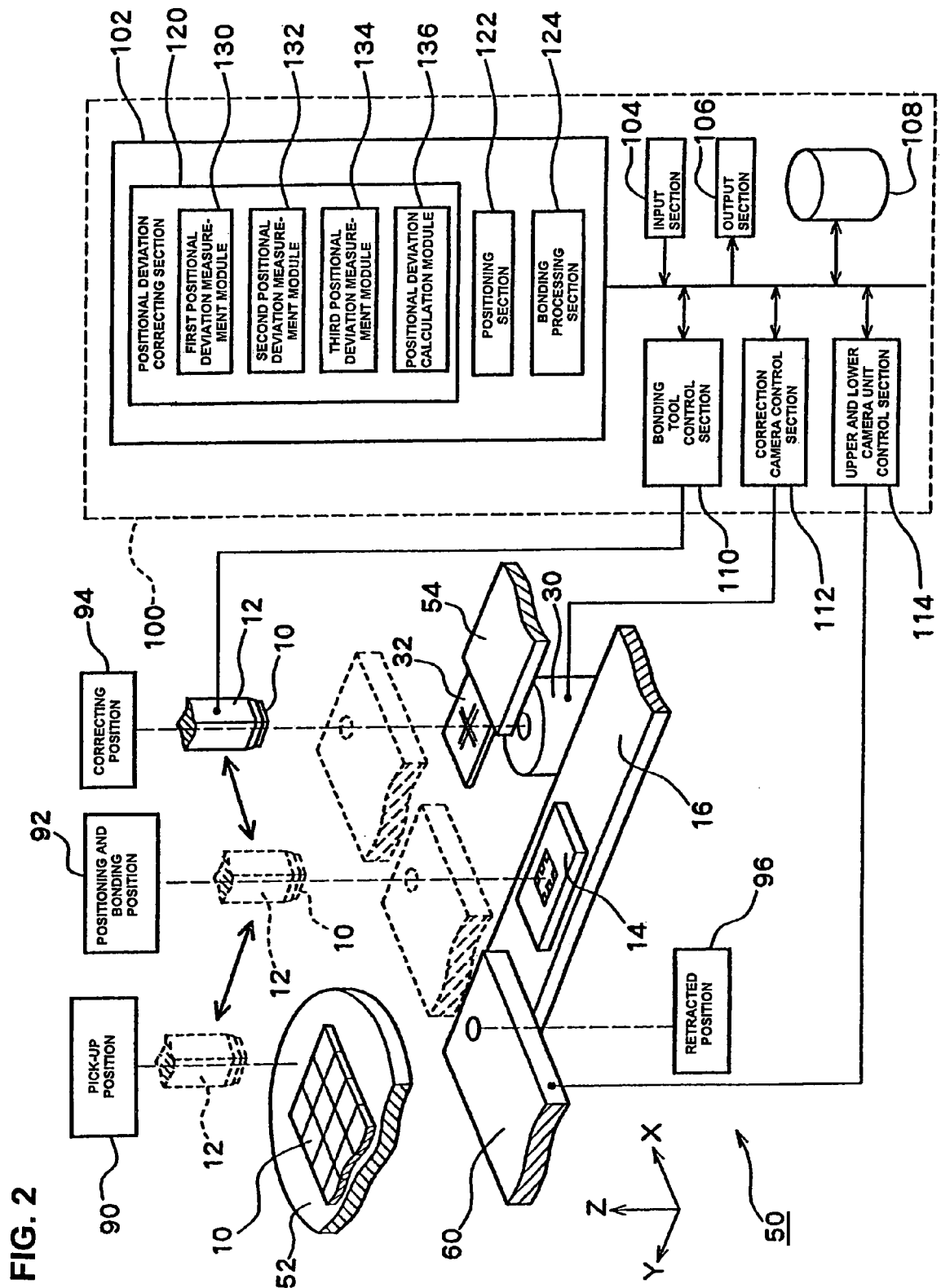
FIG. 2 is a structural diagram of a bonding apparatus according to one embodiment of the present invention.

FIG. 2 is a structural diagram of the bonding apparatus 50.

The bonding apparatus 50 comprises a bonding tool 12 which holds the back side of a chip 10 by vacuum suction, etc., a carrier 16 which holds and conveys the substrate 14, a supply station 52 which supplies chips 10, upper and lower camera unit 60 which detects the positions of the substrate 14 and chip 10, a correction camera 30 which is used to correct the positional deviation in bonding, a target 32 (used as a position reference) which is held in a target holder 54, and a control device 100 which controls the operations of these elements.

The bonding tool 12 is a member with the shape of a square pyramid which has a chip holding part on the tip end. A vacuum suction hole which communicates with the chip holding part is formed in the center, and suction holding of the chip 10 can be accomplished in the chip holding part under the control of the control device 100. Furthermore, the bonding tool 12 is connected to a transducer (not shown in the drawings), so that ultrasonic energy can be applied to the chip 10 held in the chip holding part under the control of the control device 100.

The bonding tool 12 is mounted on a moving mechanism (not shown in the drawings), and can move in the X, Y and Z directions shown in FIG. 2 under the control of the control device 100. In concrete terms, the bonding tool 12 can move between a pickup position 90 which is a position where the chip 10 is picked up from the supply station 52, a positioning and bonding position 92 which is a position where the chip 10 and substrate 14 are positioned, and where bonding is subsequently performed, and a correcting position 94 which is used to determine the amount of correction for positioning. In the respective positions, the bonding tool 12 can be moved upward and downward in the Z direction; furthermore, the bonding tool can be moved horizontally or at an inclination between the respective positions.

The carrier 16 is a jig which holds the substrate 14, and is conveyed in the Y direction by a conveying mechanism such as a conveyor, etc. (not shown in the drawings). The control of this conveying is performed by the control device 100, so that the substrate 14 is conveyed from the supply opening, and stops in the positioning and bonding position 92. After the positioning of the chip 10 and substrate 14 and the bonding of the chip 10 have been performed in the positioning and bonding position 92, the substrate 14 is conveyed toward the discharge opening; at the same time, the next substrate is conveyed and stopped in the positioning and bonding position 92.

Figure 3:
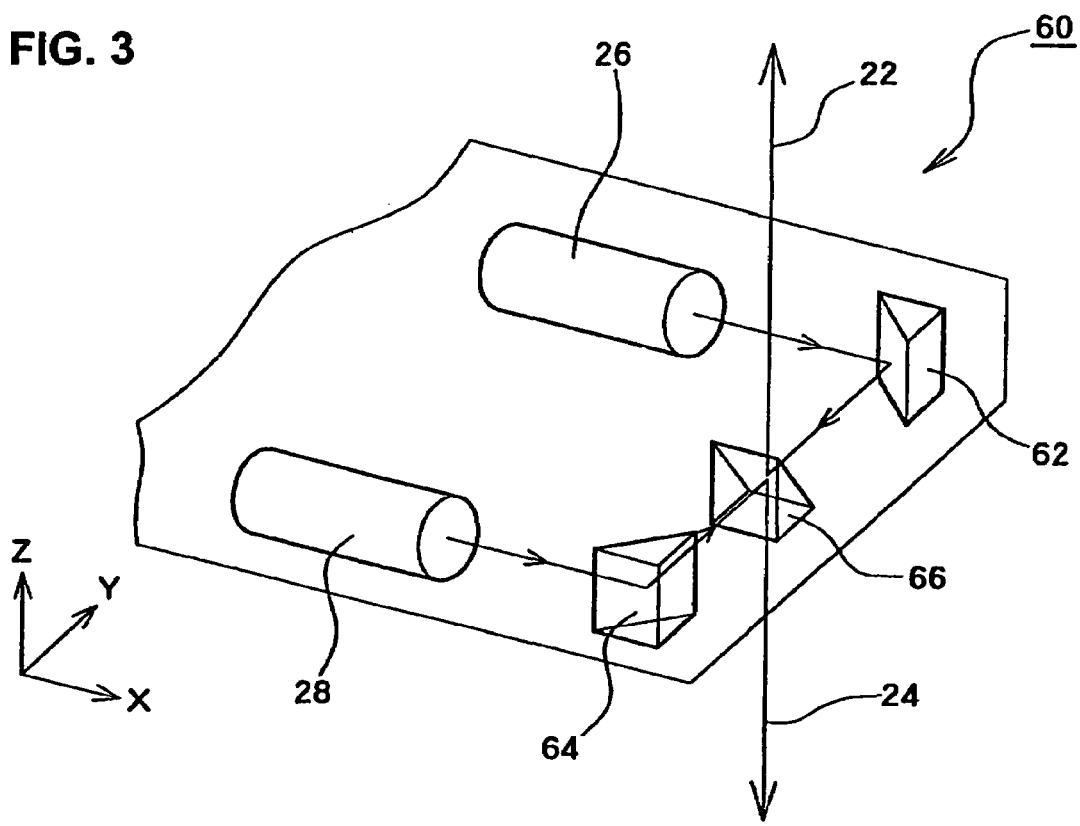
FIG. 3 is a diagram which shows the internal construction of the upper and lower camera unit.

The upper and lower camera unit 60 constitutes an optical part which has two cameras inside. The internal construction of the upper and lower camera unit 60 is shown in FIG. 3.

The upper and lower camera unit 60 comprises, inside an appropriate housing, a first camera 26, second camera 28, reflective mirrors 62 and 64, and a two-sided reflective mirror 66. The first camera 26 and second camera 28 are imaging devices that have CCD (charged coupled devices); the aperture parts of these cameras both face in the +X axis direction, and the cameras are disposed in positions that are symmetrical with respect to the central axis of the upper and lower camera unit 60 in the X direction. The reflective surfaces of the reflective mirrors 62 and 64 have respective inclinations of −45 degrees and +45 degrees about the Z axis with respect to the X axis, and are disposed symmetrically with respect to the central axis of the upper and lower camera unit 60 in the X direction. The reflective surfaces on both sides of the two-sided reflective mirror 66 have an inclination of 45 degrees with respect to the XY plane, and this two-sided reflective mirror 66 is disposed in a position where the central axis of the upper and lower camera unit 60 intersects with a line connecting the reflective mirror 62 and reflective mirror 64.

The operation of the upper and lower camera unit 60 with such an internal construction will be described. The optical axis expressing the imaging center of the first camera 26 faces in the +X direction from the aperture part, and the orientation of this axis is altered 90 degrees by the reflective mirror 62 so as to face in the −Y direction; then the orientation is altered 90 degrees by the upper side reflective surface of the two-sided reflective mirror 66 so as to face in the +Z direction. In other words, this becomes the upward-oriented optical axis 22, and faces to the outside of the upper and lower camera unit 60. On the other hand, the optical axis expressing the imaging center of the second camera 28 faces in the +X direction from the aperture part, and the orientation of this axis is altered 90 degrees by the reflective mirror 62 so as to face in the +Y direction; then the orientation is altered 90 degrees by the lower side reflective surface of the two-sided reflective mirror 66 so as to face in the −Z direction. In other words, this becomes the downward-oriented optical axis 24, and faces to the outside of the upper and lower camera unit 60.

Thus, the upper and lower camera unit 60 has the function of causing the optical axis 22 expressing the imaging center of the first camera 26 to face upward, and causing the optical axis 24 expressing the imaging center of the second camera 28 to face downward, so that these optical axes are caused to face toward the outside. In the upper and lower camera unit 60, the optical axis 22 and optical axis 24 are built into the housing beforehand with opposite orientations so that these optical axes coincide at the time of assembly.

In cases where the first camera 26 and second camera 28 have the same performance, the height position of the upper and lower camera unit 60 is set at a height position that is intermediate between the height position Z1 of the substrate 14 and the height position Z2 of the chip 10 during positioning. Furthermore, the overall optical system is designed so that in the positioning of the substrate 14 and the chip 10 held by the bonding tool 12, the first camera 26 is focused on the surface of the chip 10, and the second camera 28 is focused on the surface of the substrate 14.

Ordinarily, the upper and lower camera unit 60 is retracted to a retracted position 96 so as not to interfere with the bonding work; the upper and lower camera unit 60 can be moved in the X direction from this position under the control of the control device 100. In concrete terms, the upper and lower camera unit 60 can be moved to the positioning and bonding position 92 and correcting position 94.

The correction camera 30 is an imaging device which has a CCD, and is disposed in the correcting position 94. The aperture part of this camera is oriented upward, i.e., is caused to face in the +Z direction, and the height position of the camera is set so that the focal position is at the height Z1 of the surface of the substrate 14. Alternatively, the correction camera 30 may also be formed as a telecentric optical system.

Figure 4:
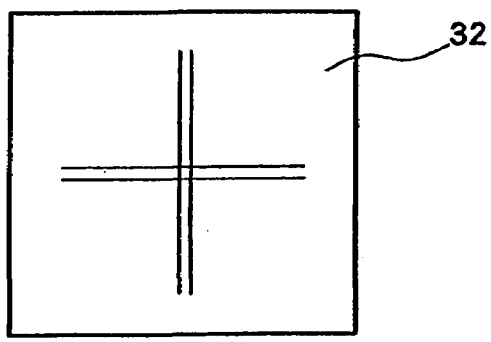
FIG. 4 is a top view of the target.

The target 32 is a thin transparent plate which is held by a target holder 54; a cross-hair pattern which serves as a position reference is formed on this target 32. The target 32 is disposed above the correction camera 30 in the correcting position 94. FIG. 4 shows a top view of the target 32. A thin plastic plate, thin glass plate or the like can be used as the thin transparent plate. The cross-hair pattern can be formed by etching or the like in the thin transparent plate. The position reference may be some pattern other than a cross-hair pattern, as long as this pattern is a stable pattern that allows measurement with sufficient precision.

It is desirable that the position reference on the target 32 be disposed on the upper-surface of the target 32, i.e., on the surface that faces the bonding tool 12. The height position of the position reference that is formed is set at the height position Z1 of the substrate 14. If the surface of the chip 10 held by the bonding tool 12 is thus caused to coincide with the upper-surface of the target 32 in the correcting position 94, both the surface of the chip 10 and the position reference of the target 32 will be at the height of the height position Z1 of the substrate 14, so that these parts can be simultaneously observed by the correction camera 30.

The position of the target holder 54 is fixed except during maintenance work, etc. Of course it is also possible to make the target holder 54 movable in the Y direction, so that retraction of the target 32 from the area above the correction camera 30 is possible. In this case, the observation of the surface of the chip 10 held by the bonding tool 12 at the height Z1 in the correcting position 94, and the observation of the position reference of the target 32, can be performed separately. Furthermore, it is sufficient if the position reference of the target 32 can be observed from both sides by the correction camera 30 and second camera. For example, the matrix material of the target 32 can be formed as a thin opaque plate, and a position reference can be disposed on both surfaces of this plate.

Next, the construction of the control device 100 will be described. The control device 100 has the function of controlling the respective elements that constitute the bonding apparatus; in particular, this is a device which has the functions of acquiring image data from the first camera 26 and second camera 28 inside the upper and lower camera unit 60 and the correction camera 30, and performing positioning and corrections in positioning based upon such data. This device is generally constructed from a computer.

In concrete terms, in the correcting position 94, the control device 100 has the functions of controlling the operation of the upper and lower camera unit 60 and bonding tool 12, acquiring the necessary image data from the three cameras, processing this data, and calculating the positional deviation in bonding. When necessary, the control device 100 may also control the operation of the target holder 54 by means of a target holder control part (not shown in the drawings). Furthermore, in the positioning and bonding position 92, the control device 100 has the functions of controlling the operation of the upper and lower camera unit 60 and bonding tool 12, as well as the operation of the carrier 16 if necessary, acquiring the necessary image data from the upper and lower camera unit 60, performing relative positioning of the substrate 14 and chip 10 held by the bonding tool 12 so that the positional deviation in bonding calculated in the correcting position 94 is corrected, and performing bonding work. Software can be used to perform the processing corresponding to these functions, and the specified processing can be performed by executing a corresponding positional deviation correction program and bonding program. A portion of the processing may also be performed by means of hardware.

The control device 100 includes a CPU 102, an input section 104 such as a keyboard or the like, an output section 106 which is a display such as a display panel or the like, an external memory device 108, a bonding tool control section 110 which controls the operation of the bonding tool 12, a correction camera control section 112 which controls the imaging operation of the correction camera 30 and receives image data, and an upper and lower camera unit control section 114 which controls the operation of the upper and lower camera unit 60, controls the imaging operation of the first camera 26 and second camera 28 contained in the upper and lower camera unit 60, and receives image data. These parts are connected to each other by an internal bus.

The CPU 102 includes a positional deviation correcting section 120, a positioning section 122, and a bonding processing section 124. Modules contained in the positional deviation correcting section 120 (i.e., the first positional deviation measurement module 130 through the positional deviation calculation module 136) have the functions of calculating three positional deviation vectors corresponding to $X_1$, $X_2$ and $X_3$ described in the principle of the invention, and determining a two-dimensional correction amount Δ(X, Y). These functions will be described with reference to FIGS. 5 through 12.

Figure 5:
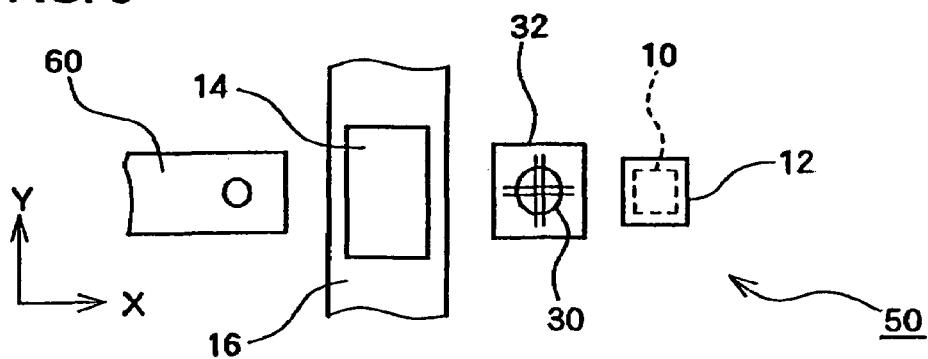
FIG. 5 is a diagram which shows in model form the top view layout of a bonding apparatus according to an embodiment of the present invention.
Figure 6:
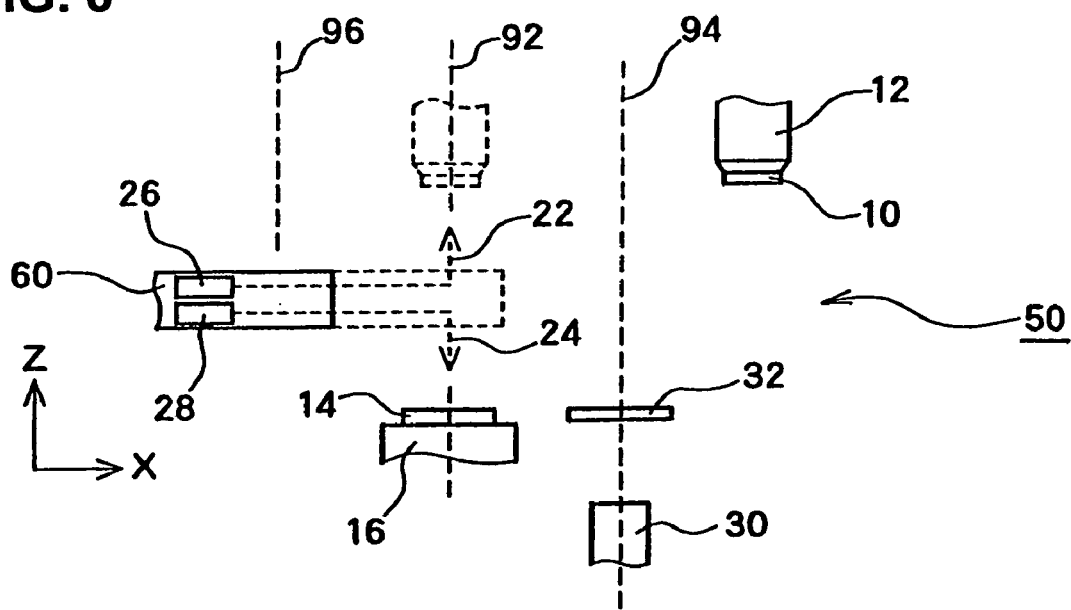
FIG. 6 is a diagram which shows in model form the side view layout of a bonding apparatus according to an embodiment of the present invention.

FIG. 5 is a diagram which shows in model form the top view disposition of the upper and lower camera unit 60, the substrate 14 held on the carrier 16, the target 32 and correction camera 30 disposed beneath this target, and the bonding tool 12 holding the chip 10, among the constituent elements of the bonding apparatus 50. FIG. 6 is a diagram which shows in model form the side view disposition of these constituent elements. FIGS. 5 and 6 show the initial state of the bonding apparatus 50. More specifically, the substrate 14 is positioned in the positioning and bonding position 92, and the target 32 and correction camera 30 are disposed in the correcting position 94. Furthermore, the upper and lower camera unit 60 is positioned in the retracted position 96, and the bonding tool 12 may also be in the pick-up position 90 or the like, but is shown as being retracted to the side of the correcting position 94 in order to indicate that this state is the initial state.

Figure 7:
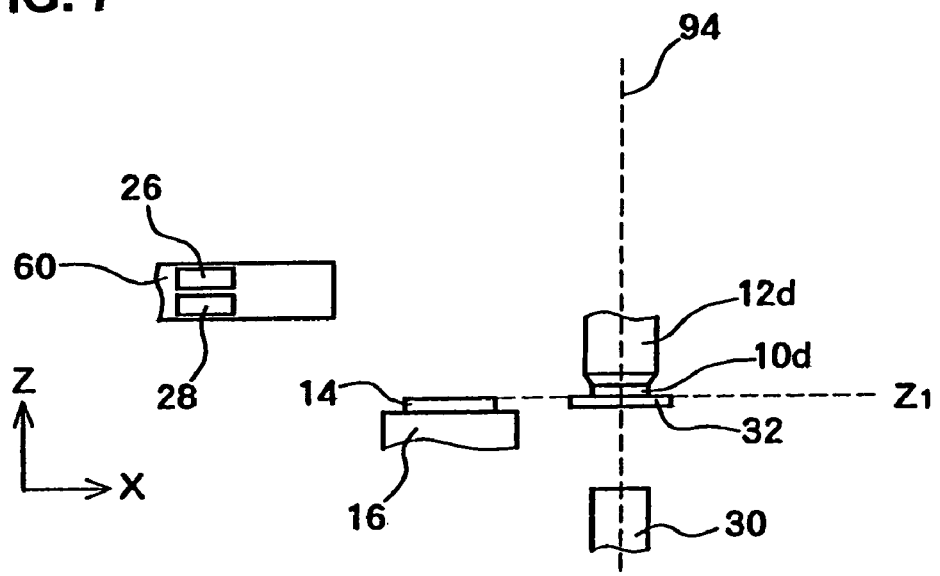
FIG. 7 is a side view layout diagram illustrating the determination of the first positional deviation in an embodiment of the present invention.

The first positional deviation measurement module 130 of the CPU 102 has the following function: specifically, in the correcting position 94, the bonding tool 12 holding the chip 10 is caused to approach the upper-surface of the target 32, this state is imaged by the correction camera 30, and the first positional deviation is determined based upon this image data. In concrete terms, this first positional deviation measurement module 130 includes the following several functions. First, a command is sent to the bonding tool control section 110, so that the bonding tool 12 is moved to the correcting position, and is further lowered toward the target 32 to Z1, which is the height position of the substrate 14. Next, a command is sent to the correction camera control section 112, so that imaging instructions are output; accordingly, image data is acquired, and the acquired image data is transferred to the first positional deviation measurement module 130. Then, the first positional deviation is determined based upon this transferred image data. FIG. 7 shows the conditions of imaging of the chip 10d (which has been lowered to the target 32) by the correction camera 30.

Figure 8:
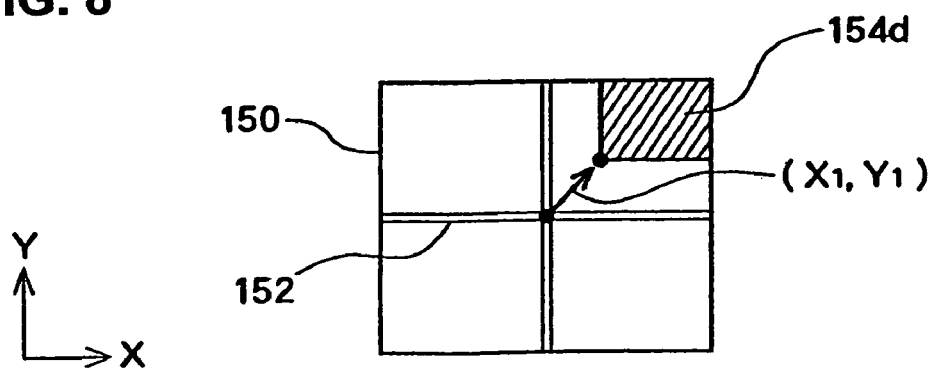
FIG. 8 is a diagram which shows the conditions of the image data that is obtained when the first positional deviation is determined in an embodiment of the present invention.

FIG. 8 is a diagram which illustrates the conditions of determination of the first positional deviation $(X_1, Y_1)$ from the image data acquired by means of the correction camera 30.

The image data is actually data in which the target 32 and chip 10 are imaged with the correction camera 30 facing upward (in the +Z direction). In FIG. 8, however, for convenience of description, this data is shown as data that has been converted into data seen from above the correcting position 94. Likewise, in the case of the image data shown in FIGS. 10 and 12, etc., below, the data is all shown as data seen from above the correcting position 94. In the image data 150 shown in FIG. 8, the cross-hair pattern 152 of the target 32 is located in the center of the visual field, and the edge of the reference pattern 154d of the chip 10d at the height position Z1 of the substrate 14 is located on the upper right. It is sufficient if a pattern which is the same as that used in the measurement of the third positional deviation (described later) can be used as the reference pattern of the chip 10d. For example, a pattern with the shape of a specific electrode pad or a specific edge shape pattern of the chip 10d can be used. The first positional deviation $(X_1, Y_1)$ is given by a vector that is oriented toward the edge of the reference pattern 154d (which is the reference position of the chip 10d at the height position Z1 of the substrate 14) from the position reference, with the intersection point of the cross-hair pattern 152 used as this position reference. In this case of one dimension, this is the distance to the reference position of the chip 10d at the height Z1 as seen from the position reference of the target 32, and is the value $X_1$ described in the principle of the present invention.

Figure 9:
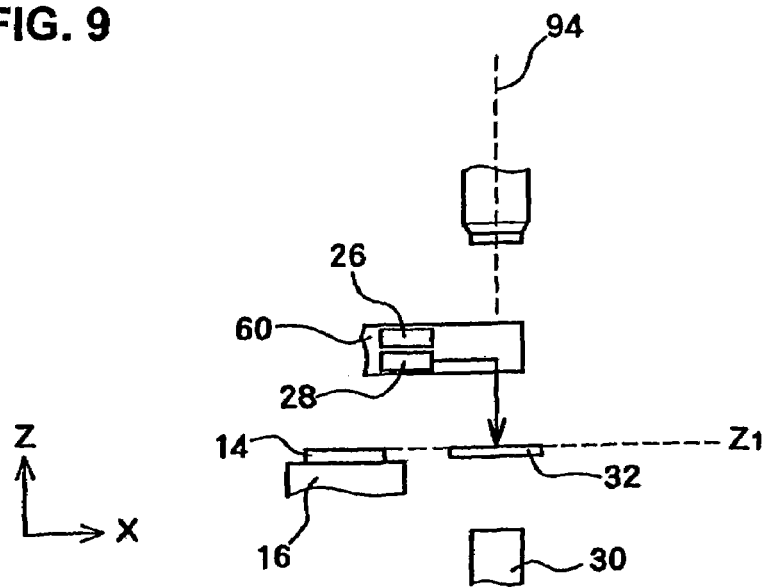
FIG. 9 is a side view layout diagram illustrating the determination of the second positional deviation in an embodiment of the present invention.

The second positional deviation measurement module 132 has the functions of imaging the target 32 by means of the second camera 28 in the correcting position 94, and determining the second positional deviation based upon the image data. In concrete terms, this module includes the following several functions. First, a command is sent to the bonding tool control section 110, so that the bonding tool 12 is raised from Z1, which is the height position of the substrate 14, thus ensuring a space which makes it possible to move the upper and lower camera unit 60 into the correcting position 94. Next, considering the measurement of the third positional deviation that will be described later, it is desirable to raise the bonding tool 12 to Z2, which is the height of the focal position of the first camera 26. Next, a command is sent to the upper and lower camera unit control section 114, so that the upper and lower camera unit 60 is moved into the correcting position 94. Then, imaging instructions are issued to the second camera 28, so that image data is acquired, and the acquired image data is transferred to the second positional deviation measurement module 130. Then, the second positional deviation is determined based upon this transferred image data. FIG. 9 shows the conditions of imaging of the target 32 by the second camera 28.

Figure 10:
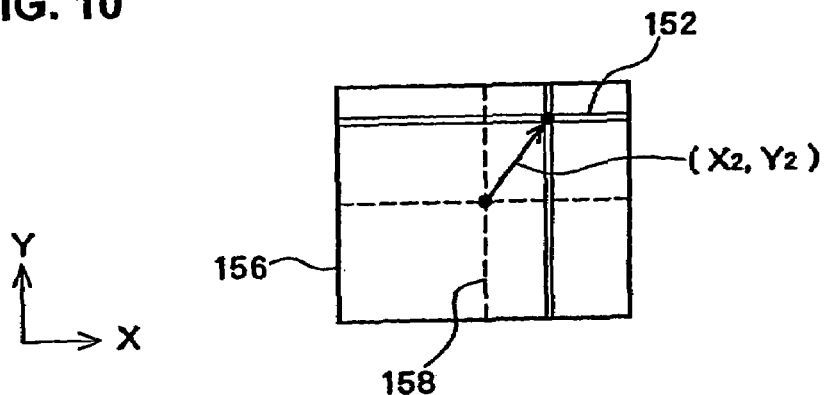
FIG. 10 is a diagram which shows the conditions of the image data that is obtained when the second positional deviation is determined in an embodiment of the present invention.

FIG. 10 is a diagram which illustrates the conditions of determination of the second positional deviation $(X_2, Y_2)$ from the image data acquired by the second camera 28.

In the image data 156 shown in FIG. 10, a cruciform pattern 158 indicating the imaging center of the second camera 28 is positioned in the center of the visual field, and the cross-hair pattern 152 of the target 32 is positioned to the upper right of this cruciform pattern. The second positional deviation $(X_2, Y_2)$ is given by a vector that is oriented toward the intersection point of the cross-hair pattern 152 (which is the position reference of the target 32) from the imaging reference position, with the intersection point of the cruciform pattern 158 indicating the imaging center of the second camera 28 taken as this imaging reference position. In the case of one dimension, this is the distance to the position reference of the target 32 as seen from the position of the optical axis 24 expressing the imaging center of the second camera 28, and is the value $X_2$ described in the principle of the present invention.

Figure 11:
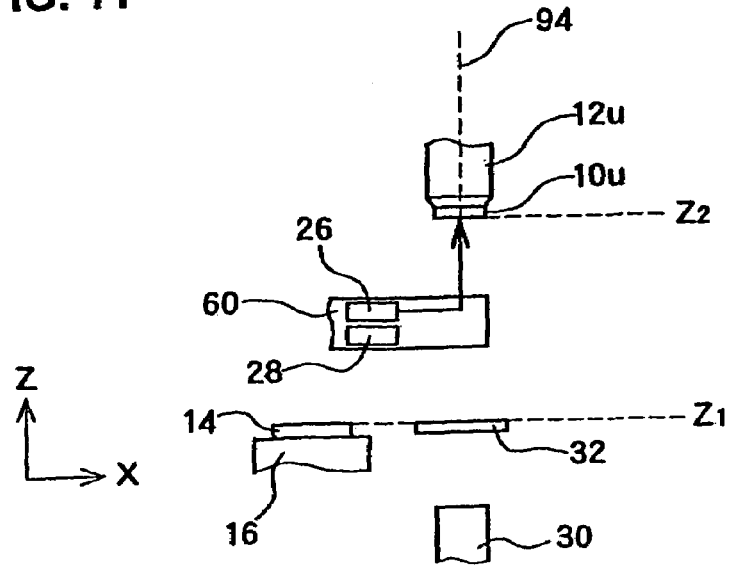
FIG. 11 is a side view layout diagram illustrating the determination of the third positional deviation in an embodiment of the present invention.

The third positional deviation measurement module 134 has the functions of imaging the bonding tool 12 holding the chip 10 by means of the first camera 26 in the correcting position 94, and determining the third positional deviation based upon the image data. The height position of the surface of the chip 10 is set at Z2, which is the focal position of the first camera 26. In concrete terms, this module includes the following several functions. First, a command is sent to the bonding tool control section 110, so that the bonding tool 12 is raised, and this bonding tool 12 is raised to Z2, which is the height of the focal position of the first camera 26. Next, a command is sent to the upper and lower camera unit control section 114, so that imaging instructions are issued to the first camera 26; accordingly, image data is acquired, and the acquired image data is transferred to the third positional deviation measurement module 134. Then, the third positional deviation is determined based upon the transferred image data. FIG. 11 shows the conditions of imaging of the chip 10u at the height Z2 by the second camera 28.

Figure 12:
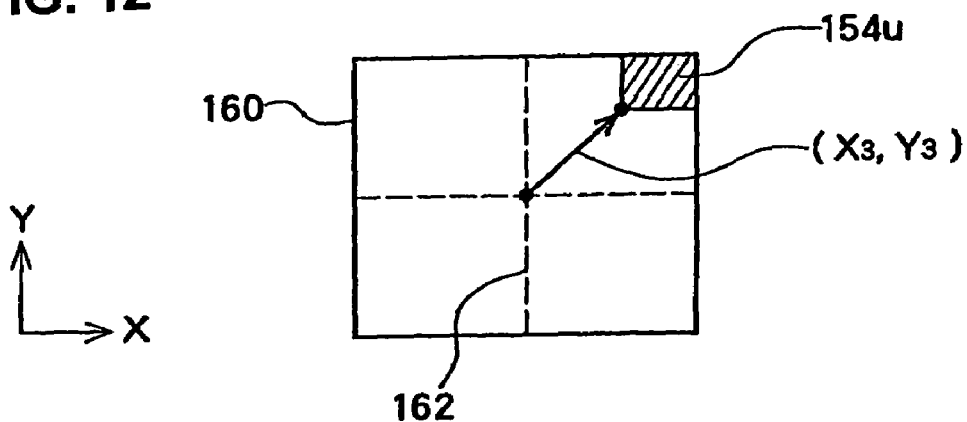
FIG. 12 is a diagram which shows the conditions of the image data that is obtained when the third positional deviation is determined in an embodiment of the present invention.

FIG. 12 is a diagram which illustrates the conditions of determination of the third positional deviation $(X_3, Y_3)$ from the image data acquired by the first camera 26.

In the image data 160 shown in FIG. 12, a cruciform pattern 162 which indicates the imaging center of the first camera 26 is positioned in the center of the visual field, and the edge of the reference pattern 154u of the chip 10u at the height Z2 is positioned to the upper right of this cruciform pattern 162. The third positional deviation $(X_3, Y_3)$ is given by a vector that is oriented toward the edge of the reference pattern 154u (which is the reference position of the chip 10u at the height Z2) from the imaging reference position, with the intersection point of the cruciform pattern indicating the imaging center of the first camera 26 taken as this imaging reference position. In the case of one dimension, this is the distance to the reference position of the chip 10u at the height Z2 as seen from the position of the optical axis 22 expressing the imaging center of the first camera 26, and is the value $X_3$ described in the principle of the invention.

The positional deviation calculation module 136 has the function of determining the correction amount $\Delta(X, Y)$ used to correct the positional deviation in bonding from the first positional deviation $(X_1, Y_1)$, second positional deviation $(X_2, Y_2)$ and third positional deviation $(X_3, Y_3)$. The correction amount $\Delta(X, Y)$ is given by Equation (3), which is obtained by expanding Equation (2) (described in the principle of the invention) to two dimensions.

$$\Delta(X, Y) = (X_3, Y_3) - [(X_2, Y_2) + (X_1, Y_1)] \quad (3)$$

Next, the positioning section 122 has the function of positioning the substrate 14 and chip 10 using the correction amount $\Delta(X, Y)$ so that there is no positional deviation in bonding. In concrete terms, the positioning section 122 includes the following several functions. First, a command is sent to the bonding tool control section 110, so that the bonding tool 12 is moved into the positioning and bonding position 92. The height position of the surface of the chip 10 held by the bonding tool 12 is set at Z2. Furthermore, a command is sent to the upper and lower camera unit control section 114, so that the upper and lower camera unit 60 is also moved into the positioning and bonding position 92. Then, imaging instructions are issued to the first camera 26 and second camera 28 contained in the upper and lower camera unit 60, so that the first camera 26 is caused to image the chip 10 held by the bonding tool 12 and the second camera 28 is caused to image the substrate 14, and these sets of image data are transferred to the positioning section 122. Based upon the transferred image data, a command is sent to the bonding tool control section 110, so that the reference position of the substrate 14 and the reference position of the chip 10 held by the bonding tool 12 are aligned. Furthermore, the positional relationship of the bonding tool 12 holding the chip 10, the substrate 14 and the upper and lower camera unit 60 at the time of positioning is indicated by the broken line in FIG. 6.

Figure 13:
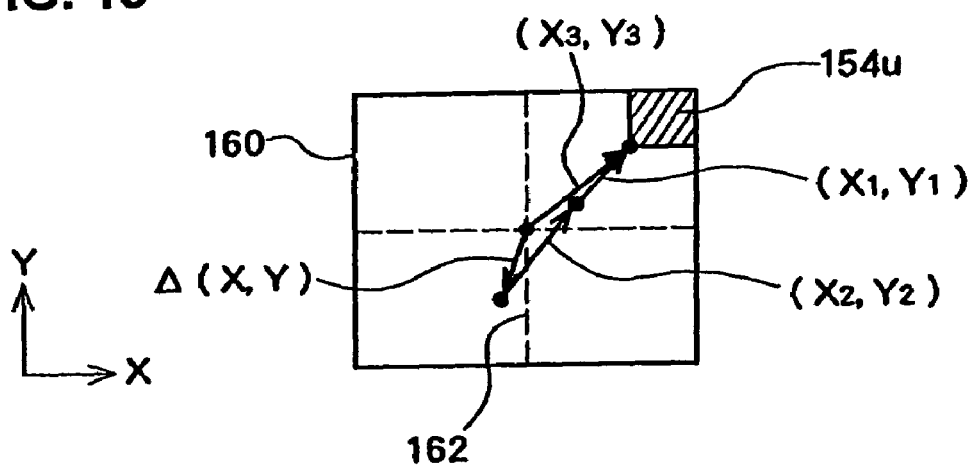
FIG. 13 is a diagram which shows the conditions of the image data that is obtained when positioning is performed by performing the processing of the correction amount $\Delta(X, Y)$ in an embodiment of the present invention.

FIG. 13 is a diagram which illustrates the conditions of positioning accomplished by performing the processing of the correction amount $\Delta(X, Y)$ in the visual field of the first camera 26.

Here, it is assumed that the image data 160 of the first camera 26 in the positioning and bonding position 92 (following movement to the positioning and bonding position 92 from the correcting position 94) is the same as that shown in FIG. 12 in the correcting position 94. In this case, the intersection point of the cruciform pattern expressing the imaging center of the first camera 26 and the edge of the reference pattern 154u which is the reference position of the chip 10u are separated by the third positional deviation $(X_3, Y_3)$. Here, in order to simplify the description, it is assumed that the reference position of the substrate 14 coincides with the imaging center of the second camera 28. In this case, the positioning of the imaging center of the first camera 26 and the reference position of the chip 10 is performed not by correcting for the third positional deviation $(X_3, Y_3)$, but rather by moving the reference position of the chip 10 to the position of the correction amount $\Delta(X, Y)$ as seen from the imaging center of the first camera 26. By doing this, it is possible to perform positioning that corrects the positional deviation in bonding in accordance with Equation (3). In order to illustrate the relationship with the correction amount $\Delta(X, Y)$, the first positional deviation $(X_1, Y_1)$ and second positional deviation $(X_2, Y_2)$ respectively determined in FIG. 8 and FIG. 10 are also shown in FIG. 13. Furthermore, in cases where the reference position of the substrate 14 does not coincide with the imaging center of the second camera 28, a similar correction can be performed by shifting the reference position of the first camera 26 by an amount corresponding to the discrepancy.

The bonding processing section 124 has the function of bonding the chip 10 to the substrate 14 after positioning that corrects the positional deviation in bonding has been performed. In concrete terms, this part includes the following several functions. After positioning has been performed in the positioning and bonding position 92, a command is sent to the upper and lower camera unit control section 114, so that the upper and lower camera unit 60 is retracted into the retracted position 96. Next, a command is sent to the bonding tool control section 110, so that the bonding tool 12 holding the chip 10 is lowered, the electrode pads on the chip 10 are caused to contact the substrate 14, and bonding is performed by applying ultrasonic energy. When the bonding processing is completed, the vacuum suction of the bonding tool 12 is stopped, and the bonding tool 12 is raised.

EMBODIMENT 2

Instead of the bonding apparatus with the above-described construction shown in FIG. 2, a bonding apparatus in which a combination of the second camera with a separate optical part is endowed with the function of the correction camera may be constructed.

Figure 14:
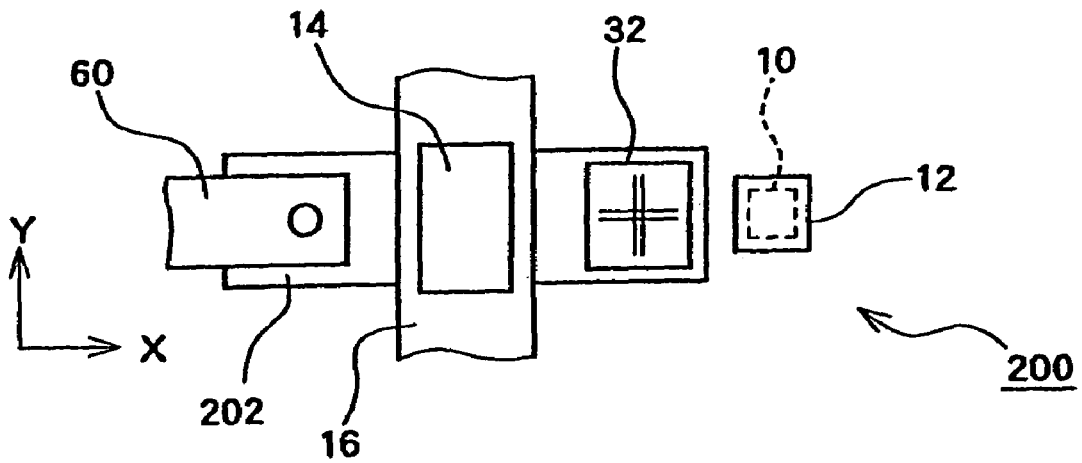
FIG. 14 is a diagram which shows in model form the top view layout of a bonding apparatus according to a second embodiment of the present invention.
Figure 15:
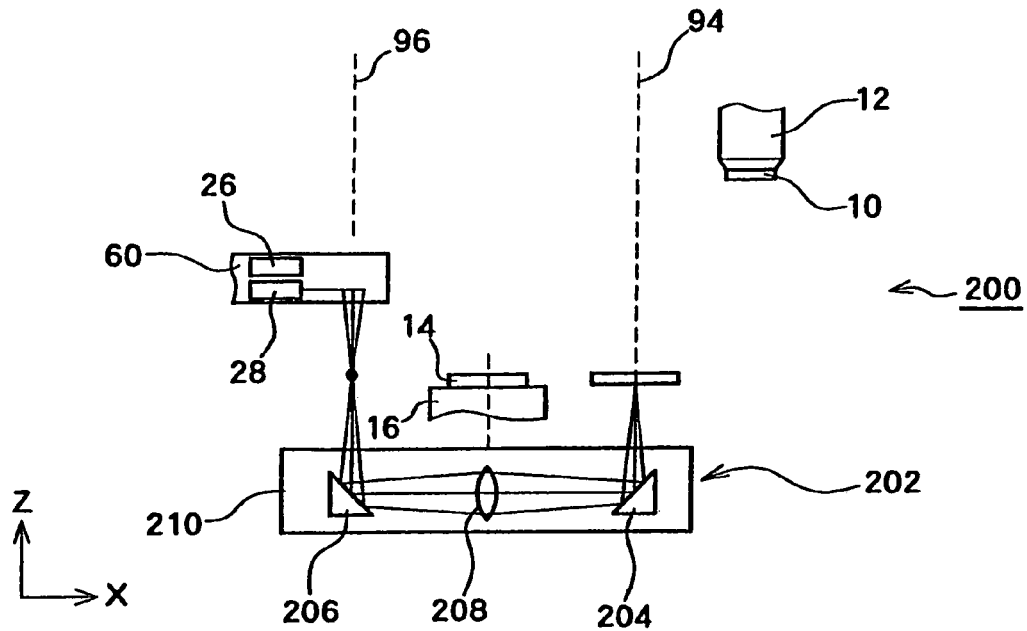
FIG. 15 is a diagram which shows in model form the side view layout of a bonding apparatus according to a second embodiment of the present invention.

FIG. 14 is a diagram which shows in model form a top view layout of the main constituent elements of a bonding apparatus 200 in which an optical part 202 that conducts an image of the target 32 to the second camera 28 is used instead of the correction camera. FIG. 15 is a diagram which shows in model form a side view layout of these constituent elements. The same symbols are assigned to elements that are the same as in FIG. 2, and a detailed description of such elements is omitted. The bonding apparatus 200 comprises a target 32, and an optical part 202 that is disposed beneath the substrate 14 and carrier 16. The optical part 202 includes a prism 204 which is disposed beneath the target 32, a prism 206 which is disposed beneath the upper and lower camera unit 60 in the retracted position 96, a lens 208 which is disposed between the prisms 204 and 206, and a housing 210 to which these parts are fastened. The prisms 204 and 206 and lens 208 are disposed inside the housing 210 so that these parts have the function of conducting an image of the target 32 to the second camera 28.

By using this optical part 202, it is possible to determine the correction amount Δ(X, Y) for correcting the positional deviation in bonding without using a correction camera.

Figure 16:
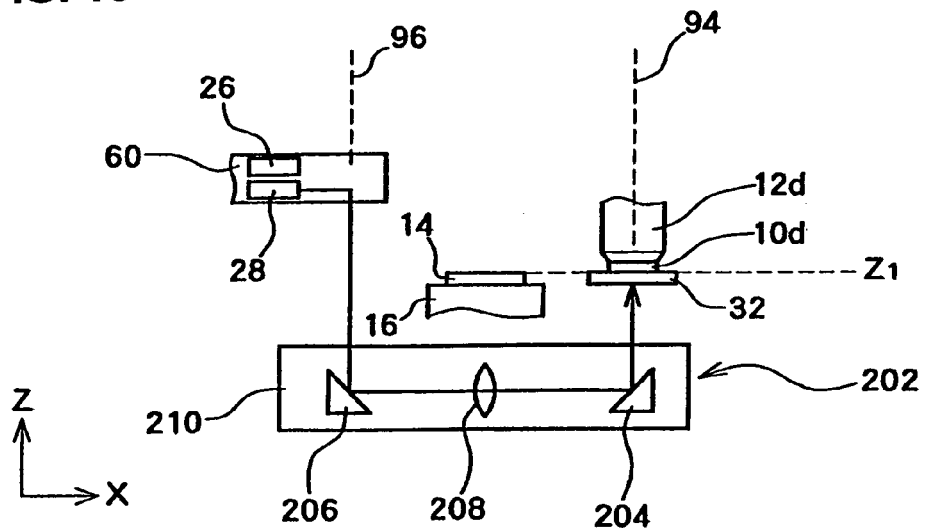
FIG. 16 is a side view layout diagram illustrating the determination of the first positional deviation in a second embodiment of the present invention.

FIG. 16 is a diagram which shows the conditions of determination of the first positional deviation $(X_1, Y_1)$ that is needed in order to calculate the correction amount Δ(X, Y). The first positional deviation $(X_1, Y_1)$ is determined by lowering the bonding tool 12 holding the chip 10, and imaging the reference position of the chip 10 and reference position of the target 32. In Embodiment 2, these images are conducted to the second camera 28 by the optical part 202, and are acquired by the second camera 28. Accordingly, the image data of the second camera 28 is the same as that shown in FIG. 8, and the first positional deviation $(X_1, Y_1)$ can be determined. The second positional deviation $(X_2, Y_2)$ and third positional deviation $(X_3, Y_3)$ are determined by the same procedure as in FIGS. 9 through 11, and the correction amount Δ(X, Y) can be determined from these deviations.

EMBODIMENT 3

Figure 17:
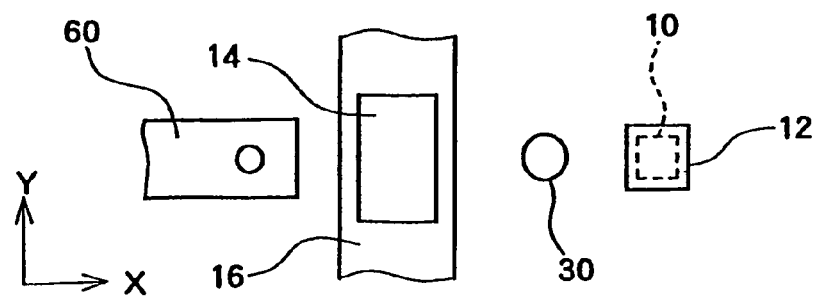
FIG. 17 is a diagram which shows in model form the top view layout of a bonding apparatus according to a third embodiment of the present invention.
Figure 18:
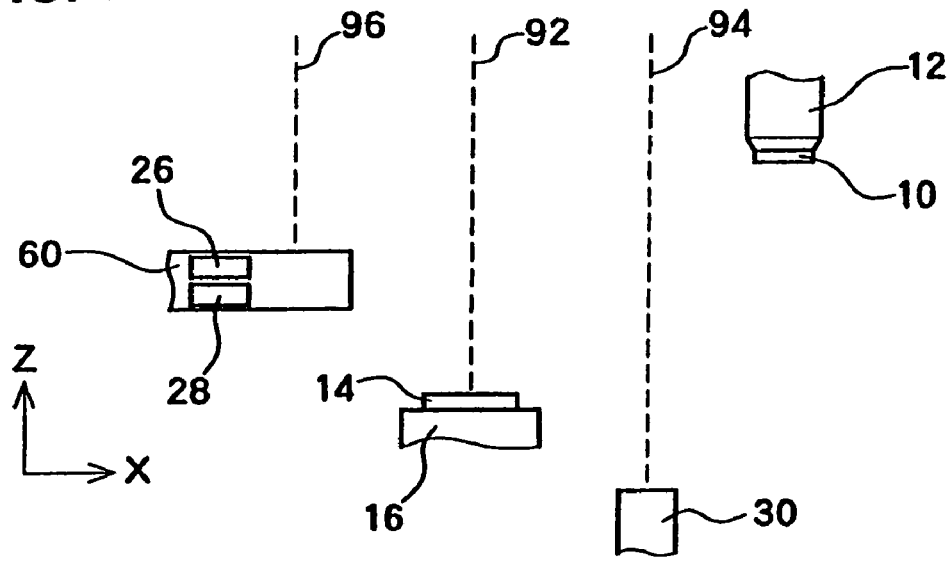
FIG. 18 is a diagram which shows in model form the side view layout of a bonding apparatus according to a third embodiment of the present invention.

Furthermore, instead of the bonding apparatus with the above-described construction shown in FIG. 2, a bonding apparatus in which the imaging reference position of the correction camera is endowed with the function of the position reference of the target may be constructed. FIG. 17 is a diagram which shows in model form a top view layout of the main constituent elements of a bonding apparatus 220 in which the imaging reference position of the correction camera 30 is used as the position reference. FIG. 18 is a diagram which shows in model form a side view layout of these constituent elements. Embodiment 3 differs from that shown in FIG. 2 in that no target 32 is installed.

By using the imaging reference position of the correction camera 30 as the position reference, it is possible to determine the correction amount Δ(X, Y) for correcting the positional deviation in bonding without using a target.

Figure 19:
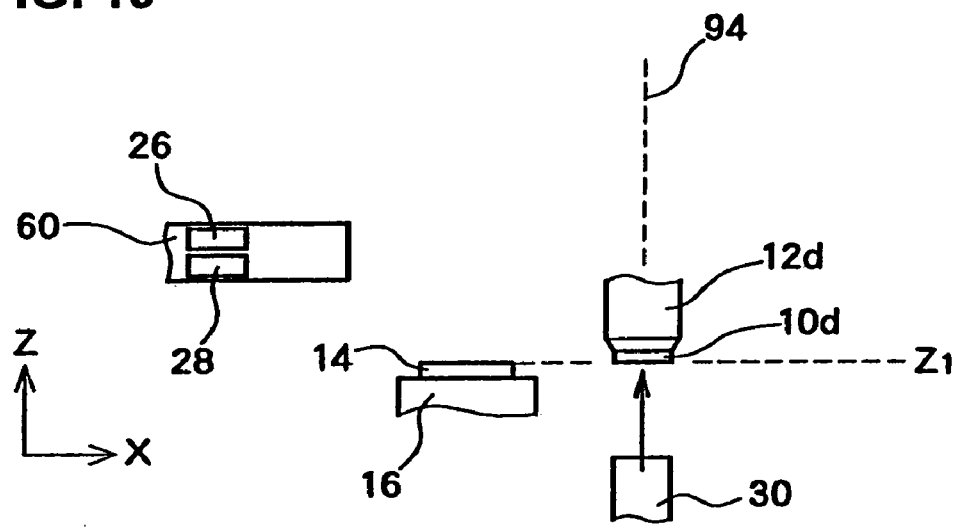
FIG. 19 is a side view layout diagram illustrating the determination of the first positional deviation in a third embodiment of the present invention.
Figure 20:
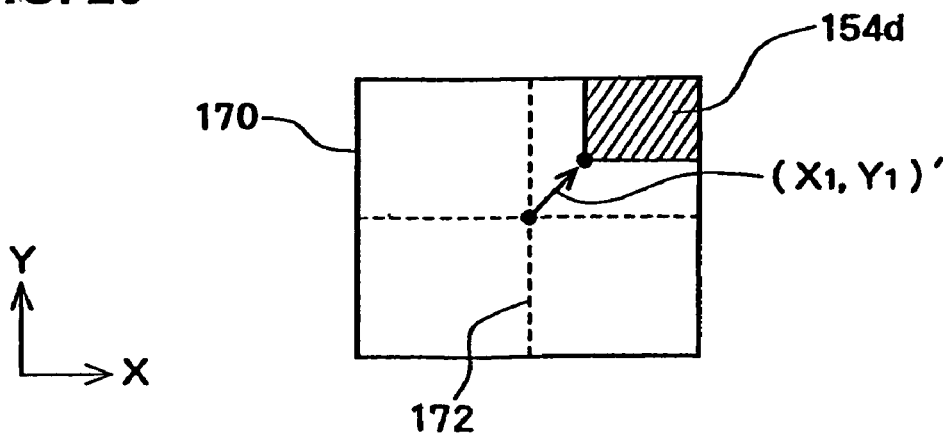
FIG. 20 is a diagram which shows the conditions of the image data that is obtained when the first positional deviation is determined in a third embodiment of the present invention.

FIG. 19 is a diagram which shows the conditions of determination of the first positional deviation $(X_1, Y_1)$ that is needed in order to calculate the correction amount Δ(X, Y). The first positional deviation $(X_1, Y_1)$ is determined by lowering the bonding tool 12 holding the chip 10 to the height position Z1 of the substrate 14, and imaging this state with the correction camera 30. FIG. 20 shows the image data 170 of the correction camera 30; the intersection point of a cruciform pattern 172 that expresses the imaging reference position of the correction camera 30 is positioned in the center of the visual field, and the edge of the reference pattern 154d which is the reference position of the chip 10d at the height Z1 appears on the upper right. Here, the first positional deviation can be taken as a vector $(X_1, Y_1)'$ which is oriented toward the edge of the reference pattern 154d (which is the reference position of the chip 10d at the height position Z1 of the substrate 14) from the position reference, with the intersection point of the cruciform pattern 172 taken as this position reference.

Figure 21:
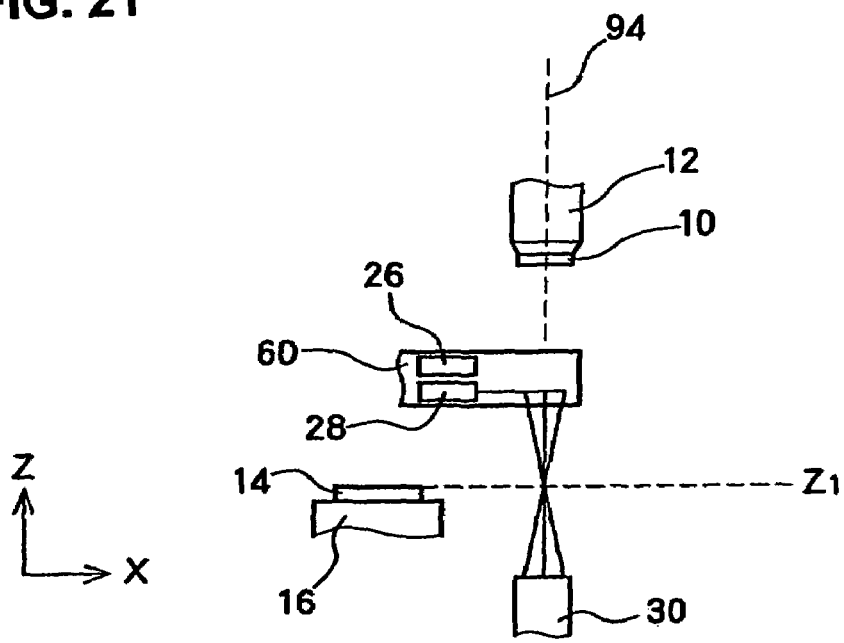
FIG. 21 is a side view layout diagram illustrating the determination of the second positional deviation in a third embodiment of the present invention.

FIG. 21 is a diagram which shows the conditions of determination of the second positional deviation $(X_2, Y_2)$.

Figure 22:
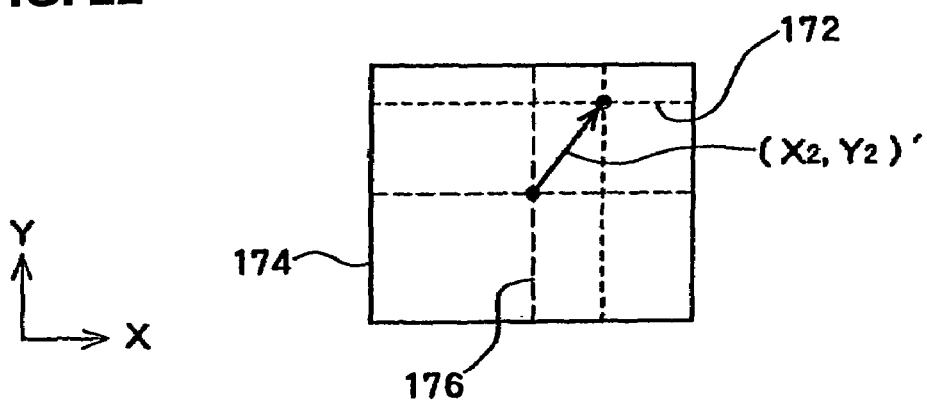
FIG. 22 is a diagram which shows the conditions of the image data that is obtained when the second positional deviation is determined in a third embodiment of the present invention.

The second positional deviation $(X_2, Y_2)$ is determined by moving the upper and lower camera unit 60 to the correcting position 94, and imaging the imaging surface of the correction camera 30 by means of the second camera 28. FIG. 22 shows the image data 174 of the second camera 28; the intersection point of a cruciform pattern 176 expressing the imaging reference position of the second camera 28 is positioned in the center of the visual field, and the intersection point of a cruciform pattern 172 indicating the imaging center of the correction camera 30 appears on the upper right. Here, the second positional deviation can be taken as a vector $(X_2, Y_2)'$ which is oriented toward the intersection point of the cruciform pattern 172 (which is the position reference of the correction camera 30) from the intersection point of the cruciform pattern 176 of the second camera 28.

Since the first positional deviation $(X_1, Y_1)'$ and second positional deviation $(X_2, Y_2)'$ thus determined are related via the imaging reference position of the correction camera 30, $(X_1, Y_1)'+(X_2, Y_2)'$, which is the vector sum of these deviations, is a vector which is oriented toward the reference position of the chip 10d at the height Z1 from the reference position of the second camera 28, and a vector which is the same as $(X_1, Y_1)+(X_2, Y_2)$ in the construction shown in FIG. 2 can be obtained. The third positional deviation $(X_3, Y_3)$ can be determined by the same procedure as that used in FIGS. 11 and 12, and the correction amount Δ(X, Y) can be determined from these deviations.

EMBODIMENT 4

Figure 23:
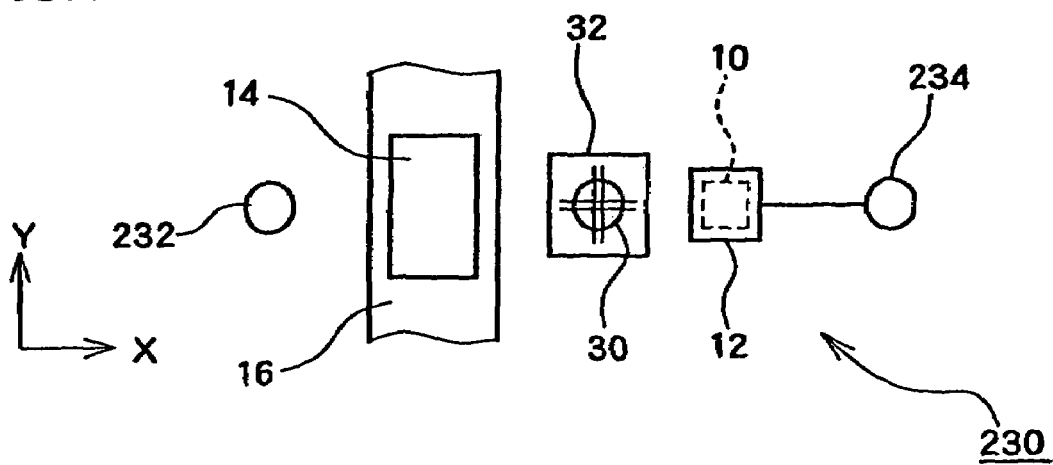
FIG. 23 is a diagram which shows in model form the top view layout of a bonding apparatus according to a fourth embodiment of the present invention.
Figure 24:
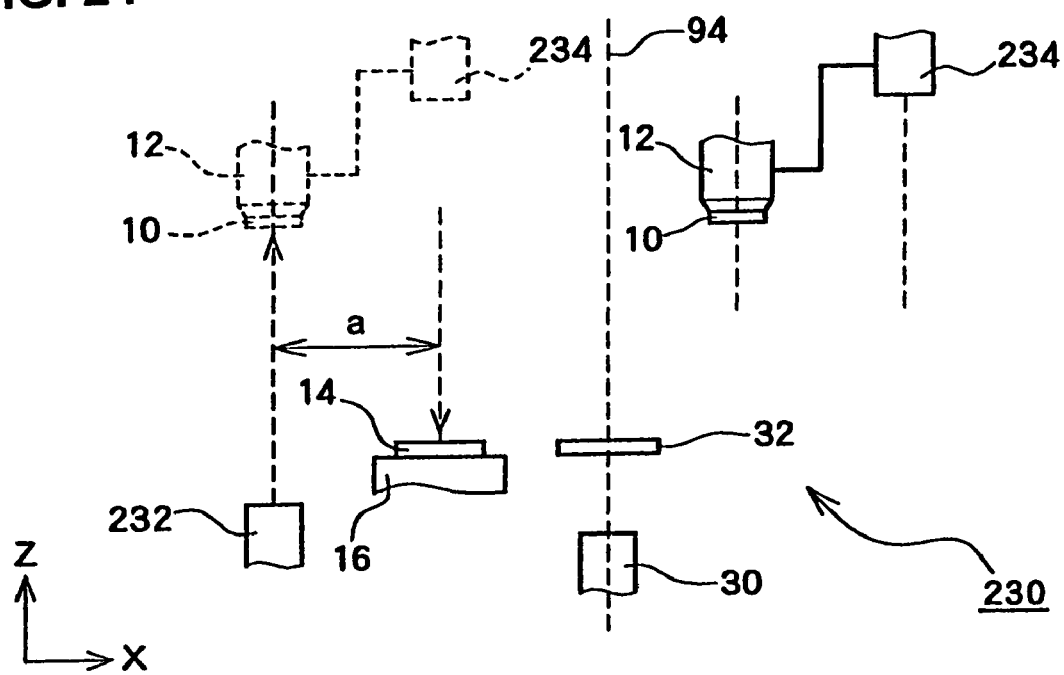
FIG. 24 is diagram which shows in model form the side view layout of a bonding apparatus according to a fourth embodiment of the present invention.

In the construction shown in FIG. 2, an upper and lower camera unit in which the first camera and second camera are moved as an integral unit, and in which the substrate and chip could be simultaneously observed. However, the present invention can also be applied to bonding apparatuses with a camera construction other than such an integral-unit type upper and lower camera unit. Model diagrams showing the top view layout and side view layout of the constituent elements of such a bonding apparatus 230 are shown in FIGS. 23 and 24. In this bonding apparatus 230, an upward-facing camera, i.e., a first camera 232, is installed below the height position Z1 of the substrate 14, and a downward-facing camera, i.e., a second camera 234, is installed above Z1. The bonding tool 12 and second camera 234 are disposed at a specified distance interval, and can both be moved with respect to movement in the X direction while maintaining this specified distance interval.

In the bonding apparatus 230 with this structure, since the first camera 232 and second camera 234 are not formed as an integral unit, the distance between the imaging center of the first camera 232 and the imaging center of the second camera 234 in the disposition state in the positioning and bonding position indicated by a broken line in FIG. 24 is measured beforehand and stored in memory as an offset amount a. Then, positioning is performed using the reference position of the chip 10 measured by the first camera 232, the reference position of the substrate 14 measured by the second camera 234, and the offset amount a.

Figure 25:
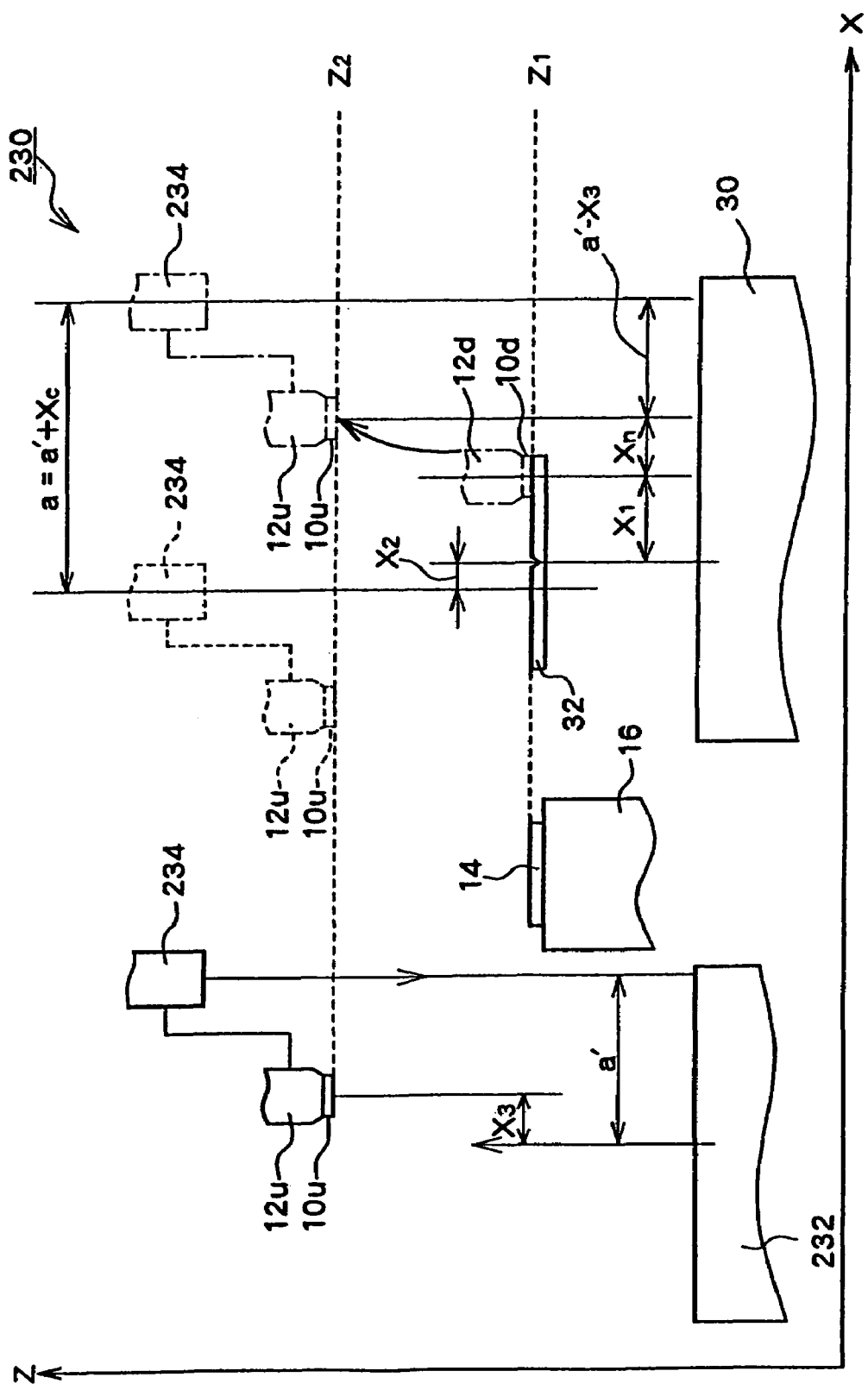
FIG. 25 is a diagram which illustrates the principle of positional deviation correction in a fourth embodiment of the present invention.

In the bonding apparatus 230 with this structure, the approach illustrated in FIG. 1 can be used with the positional deviation amount Xc between the two cameras used for positioning used as the pre-stored offset amount a. FIG. 25 is a diagram illustrating the principle of positional deviation correction in the bonding apparatus 230. The same symbols as those used in FIG. 1 are used for the respective positional deviation amounts $X_1$, $X_2$ and $X_3$, the heights Z1 and Z2, an the deviation amounts Xn and Xc.

In order to determine the correction amount ΔX for positioning, $X_1$, $X_2$ and $X_3$ are measured by the following procedure. First, as is indicated by the one-dot chain line in FIG. 25, the bonding tool 12 is lowered, and the height of the chip 10d held by the bonding tool 12d is set at the height Z1 of the target 32, i.e., at the same height as the height of the substrate 14. In this state, the chip 10d held by the bonding tool 12d and the target 32 are imaged by the correction camera 30, and the positional deviation $X_1$ to the reference position of the chip 10d at the height Z1 as seen from the center position of the target 32 is measured.

Next, the bonding tool 12 is pulled upward, so that the height of the chip 10u held by the bonding tool 12u is set at the height Z2 of the focal position of the first camera 232. In this case, a positional deviation Xn is generated by the movement of the bonding tool 12 in the direction of the Z axis. From this position, as is indicated by the broken line in FIG. 25, the bonding tool 12 and second camera 234 are moved in the X direction by the preset offset amount a. However, the actual offset amount is caused to vary by heat, etc., so that this offset amount becomes a'; accordingly, the set offset amount a is an amount in which the deviation amount Xc is further added to the actual offset amount a'. In this state, the target 32 is imaged by the second camera 234, and the positional deviation $X_2$ from the imaging center of the second camera 234 to the center position of the target 32 is measured.

Then, as shown by the solid line in FIG. 25, the bonding tool 12 and second camera 234 are returned to the positioning and bonding position, the chip 10u at the height Z2 held by the bonding tool 12u is imaged by the first camera 232, and the positional deviation $X_3$ from the imaging center of the first camera 232 to the reference position of the chip 10u at the height Z2 as seen from the imaging center of the first camera 232 is measured.

According to FIG. 25, the relationship of the positional deviation amounts $X_1$, $X_2$ and $X_3$, the offset amount a' an the deviation amounts Xc and Xn thus measured is as follows:

$$a' + Xc = X_2 + X_1 + Xn + (a' - X_3)$$

In other words, $Xc = X_2 + X_1 + Xn - X_3$, and the correction amount $\Delta X$ for positioning is indicated by the same Equation (2) illustrated in FIG. 1.

$$-Xc + Xn = \Delta X = X_3 - (X_2 + X_1) \quad (2)$$

Thus, the third positional deviation amount $X_3$ can be determined from the first positional deviation amount $X_1$, the correction amount $\Delta X$ can be calculated by Equation (2) based upon these deviation amounts, and the positional deviation in bonding can be corrected.

EMBODIMENT 5

In the calculation of the correction amount $\Delta(X, Y)$ in the bonding apparatus 50 shown in FIG. 2, the magnifications and inclinations of the first camera 26, second camera 28 and correction camera 30 can be determined as follows.

The magnification and inclination of the second camera 28 can be determined by moving the second camera 28 to the vicinity of the correcting position 94, and moving the second camera 28 while observing the target 32 with this position used as a reference. FIG. 10 shows an outline of the visual field of the second camera 28 in the correcting position 94. Using this as a reference state, the second camera 28 is moved a specified distance, e.g., +d2 in the +X direction. In this case, the cross-hair pattern 152 of the target 32 also moves in the visual field; if the amount of movement in the image data is designated as +D2, then the magnification of the second camera 28 is given by (D2/d2). Furthermore, the angle θ2 formed by the X axis of the cruciform pattern of the second camera 28 can be determined from the angle formed by the direction of the movement track of the cross-hair pattern 152 of the target 32 and the cruciform pattern 158 indicating the imaging reference position of the second camera 28, using the X axis of the cross-hair pattern 152 (which is the reference position of the target 32) as a reference.

The magnification of the correction camera 30 can be determined by lowering the bonding tool 12 holding the chip 10 to the height of the target 32 and moving the bonding tool 12 to the vicinity of the correcting position 94, and then moving the bonding tool 12d while observing the chip 10d along with the target 32, with this position used as a reference. FIG. 8 shows an outline of the visual field of the correction camera 30 in the correcting position 94. Using this as a reference state, the bonding tool 12d is moved a specified distance, e.g., +d3 in the +X direction. In this case, the image of the chip 10d also moves with respect to the cross-hair pattern 152 of the target 32 in the image data; here, if the amount of movement in the image data is designated as +D3, then the magnification of the correction camera 30 is given by (D3/d3).

The magnification of the first camera 26 can be determined as follows using the magnification (D3/d3) of the correction camera 30. The bonding tool 12 holding the chip 10 is moved to the vicinity of the correcting position 94. First, the bonding tool 12 is lowered, and the shape of the chip 10d at the height Z1 is observed by the correction camera 30. The outline of the visual field of the correction camera 30 in this state is as shown in FIG. 8; two reference points are determined on the chip in this image data, and the distance S1 between the two points is determined in the image data. Here, the actual length of S1 is determined by S1/(D3/d3). Next, the bonding tool 12 is raised, and the shape of the chip 10u at the height Z2 is observed by the first camera 26. The outline of the visual field of the first camera 26 in this state is as shown in FIG. 12; the distance s1 between the previous two reference points on the chip in this image data is determined. Here, the magnification of the first camera 26 can be determined as (D3/d3)×(s1/S1).

The inclination of the first camera 26 can be determined by the following procedure. The bonding tool 12 holding the chip 10 is moved to the vicinity of the correcting position 94. First, the bonding tool 12 is lowered, and the relationship of the shape of the chip 10d at the height Z1 and the target 32 is observed by the correction camera 30. The outline of the visual field of the correction camera 30 in this state is as shown in FIG. 8; two reference points on the chip are determined in this image data, and the angle α3 of the direction of a line segment connecting the two points in this image data with reference to the X axis of the cross-hair pattern 152 of the target 32 is determined. Next, the bonding tool 12 is raised, and the shape of the chip 10u at the height Z2 is observed by the first camera 26. The outline of the visual field of the first camera 26 in this state is as shown in FIG. 12; the angle α1 of the direction of a line segment connecting the two reference points on the previous chip in this image data with reference to the X axis of the cruciform pattern 162 indicating the imaging reference of the first camera 26 is determined. In this case, the angle θ1 formed by the X axis of the cruciform pattern 162 of the first camera 26 with reference to the X axis of the cross-hair pattern 152 of the target 32 is given by (α3−α1). Furthermore, angle formed by the imaging reference axis of the first camera 26 and the imaging reference axis of the second camera 28 can also be determined based upon θ2 and θ1. In addition, the rotation of the bonding tool that occurs during the vertical movement of the bonding tool is also simultaneously corrected.

In the above description, the disposition of reference positions, etc., on the chip held by the bonding tool is described for the measurement of the respective positional deviations and the measurement of the magnifications and inclinations of the respective cameras, needed in order to correct the deviation in bonding. In cases where the thickness of the chip is sufficiently small with respect to the height dimension, e.g., the magnitude of (Z2−Z1), the disposition of reference positions, etc., on the bonding tool is also possible. Furthermore, it is also possible to hold a measurement member, on which, for example, cruciform lines are drawn, on the bonding tool, and to use this as a reference position.

EMBODIMENT 6

The target need not be a target that can be observed from both above and below. For example, it is also possible to use a reference member such as a reference pin, etc., and to determine the first positional deviation and second positional deviation by observing the reference position of this reference member.

Figure 29:
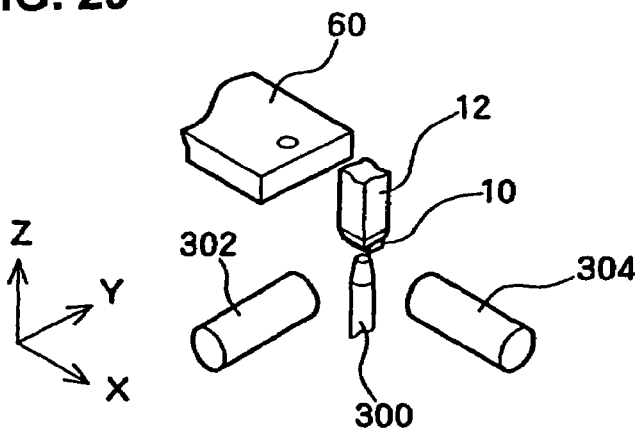
FIG. 29 is a diagram which illustrates the conditions of determination of the first positional deviation in a sixth embodiment of the present invention.
Figure 30:
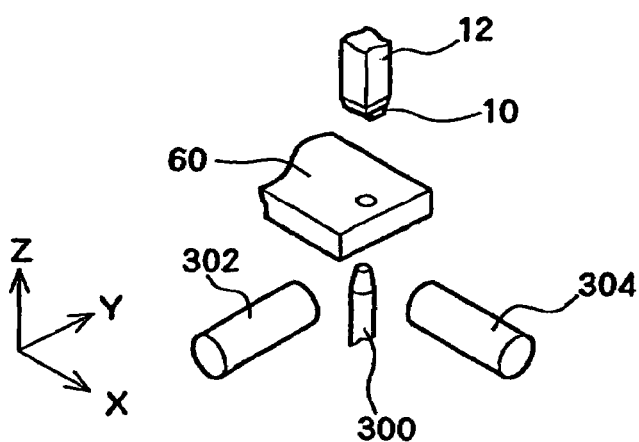
FIG. 30 is a diagram which illustrates the conditions of determination of the second positional deviation in a sixth embodiment of the present invention.

FIGS. 29 and 30 show examples in which a rod-form reference member is used as a target, and the first positional deviation and second positional deviation are determined by observing this member from the side-surface and observing this member from the upper surface. Here, the upper-surface of the reference member constituting the target is set at the same height Z1 as the bonding height of the substrate during bonding. Furthermore, as in the other Embodiments, the third deviation can be determined by observing the area between the first camera and bonding tool or chip.

FIG. 29 is a diagram showing the conditions of determination of the first positional deviation using a reference member 300. The reference member 300 preferably has a cylindrical shape or a circular conical shape with the top portion cut away (or a combination of both shapes), and it is advisable to cause the long axis of this member to coincide with the direction of the Z axis shown in FIG. 29. For example, such a reference member 300 has a cylindrical shape with a diameter of several millimeters, and further has a shape in which the tip end is made more slender by tapering. A member which is formed from a material that has an appropriate strength, etc., can be used. Other shapes and materials may also be used, as long as the shape is stable against temperature, etc.

A pair of correction cameras 302 and 304 are disposed on both side-surface sides of the reference member 300. The visual fields and resolutions of the respective correction cameras 302 and 304 that are used are such that when the bonding tool 12 or chip 10 is in close proximity to the tip end portion of the reference member 300, these parts can be observed with the required precision along with the reference member 300. Furthermore, it is desirable that the optical axis of the correction camera 302 and the optical axis of the correction camera 304 both be parallel to the XY plane shown in FIG. 29, and that these optical axes be perpendicular to each other within the same plane. Of course, it is sufficient if the positional relationship is known beforehand, even if this relationship is not an orthogonal relationship. In FIG. 29, the correction camera 302 is disposed so that this camera observes the reference member 300 in the direction of the Y axis, and captures an XZ plane image which is an image of the reference member 300 in the XZ plane. Similarly, the correction camera 304 is disposed so that this camera observes the reference member 300 in the direction of the X axis, and captures an YZ plane image which is an image of the reference member 300 in the YZ plane.

In order to determine the first positional deviation, as shown in FIG. 29, the upper and lower camera unit 60 is retracted, and the bonding tool 12 or chip 10 is lowered and caused to approach the tip end portion of the reference member 300. Specifically, the chip 10 is moved to the height Z1. Then, an XZ plane image of the reference member 300 and chip 10 is acquired by the correction camera 302, and a YZ plane image of the reference member 300 and chip 10 is acquired by the correction camera 304. In order to determine the second positional deviation, as shown in FIG. 30, the bonding tool 12 is retracted by being raised, the upper and lower camera unit 60 is moved to a position above the reference member 300, and the upper-surface of the reference member 300 is imaged by the second camera of the upper and lower camera unit 60.

Figure 31:
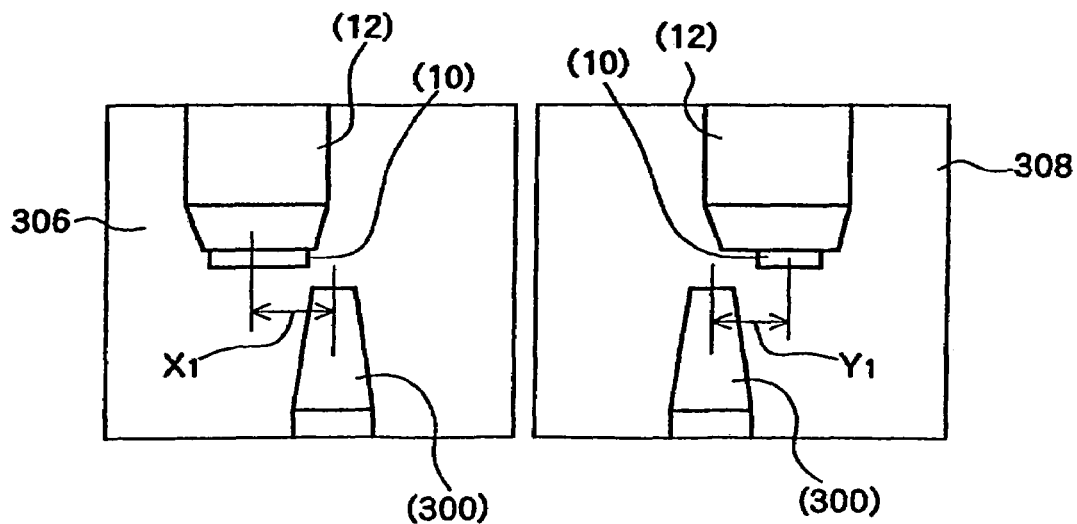
FIG. 31 is a diagram which illustrates the conditions of the image data that is obtained when the first positional deviation is determined in a sixth embodiment of the present invention.

FIG. 31 is a diagram which shows the conditions of the images that are observed by the pair of correction cameras 302 and 304 in order to determine the first positional deviation. The figure on the left side shows the image data 306 of the XZ plane image acquired by the correction camera 302, and the figure on the right side shows the image data 308 of the YZ plane image acquired by the correction camera 304. Specifically, an image of the tip end portion of the reference member (300), an image of the tip end portion of the bonding tool (12) and an image of the chip (10) are observed in the respective visual fields of the respective correction cameras 302 and 304. Accordingly, the deviation between the reference position of the reference member and the reference position of the chip in the X direction within the XZ plane, i.e., $X_1$, can be determined from the image data 306 of the correction camera 302, and the deviation between the reference position of the reference member and the reference position of the chip in the Y direction within the YZ plane, i.e., $Y_1$, can be determined from the image data 308 of the correction camera 304. Thus, the first positional deviation $(X_1, Y_1)$ can be determined.

Figure 32:
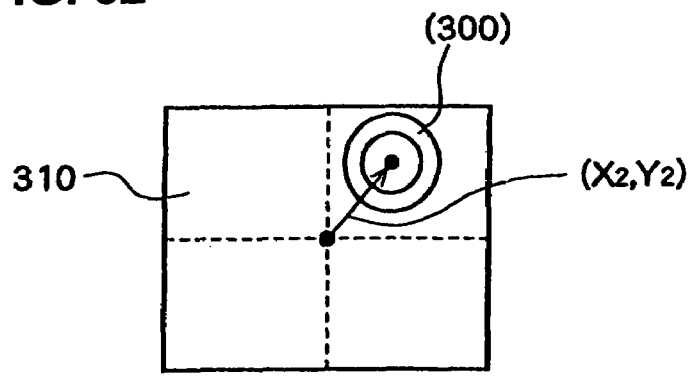
FIG. 32 is a diagram which illustrates the conditions of the image data that is obtained when the second positional deviation is determined in a sixth embodiment of the present invention.

FIG. 32 is a diagram which shows the conditions of observation by the second camera when the second positional deviation is determined; an image (300) of the upper-surface of the reference member is observed in the image data 310 of the second camera. Accordingly, the deviation between the reference position of the reference member and the reference position of the second camera, i.e., the second positional deviation $(X_2, Y_2)$ can be determined from this image data 310.

EMBODIMENT 7

Figure 33:
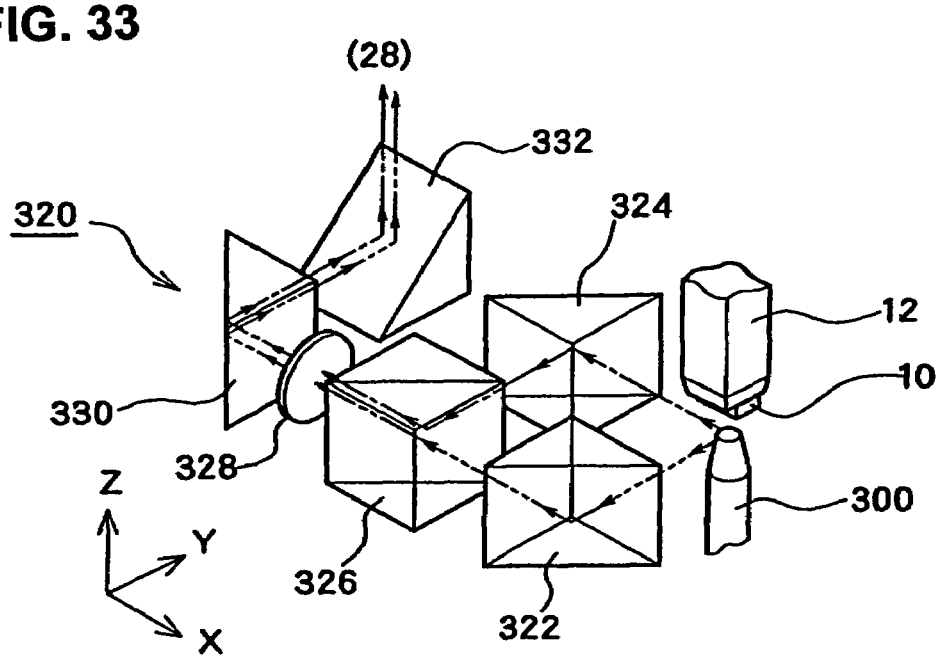
FIG. 33 is a diagram which illustrates the conditions of determination of the first positional deviation by the second camera in a seventh embodiment of the present invention.
Figure 34:
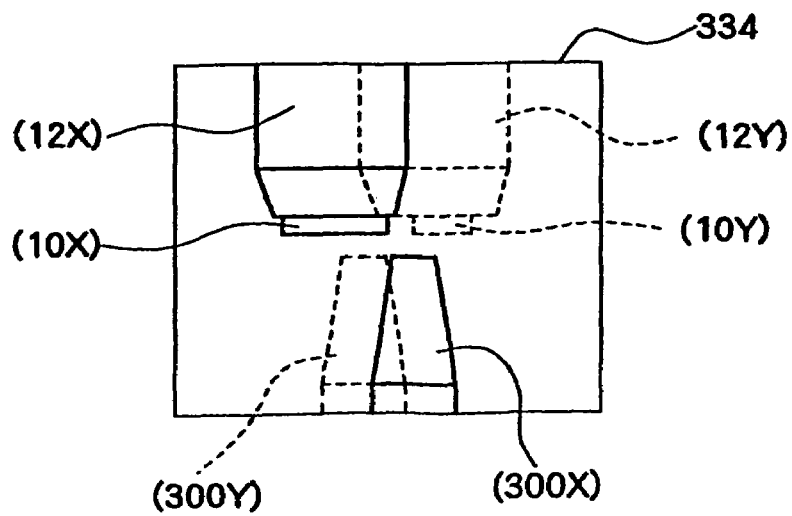
FIG. 34 is a diagram which illustrates the conditions of the image data that is obtained when the first positional deviation is determined in a seventh embodiment of the present invention.
Figure 35:
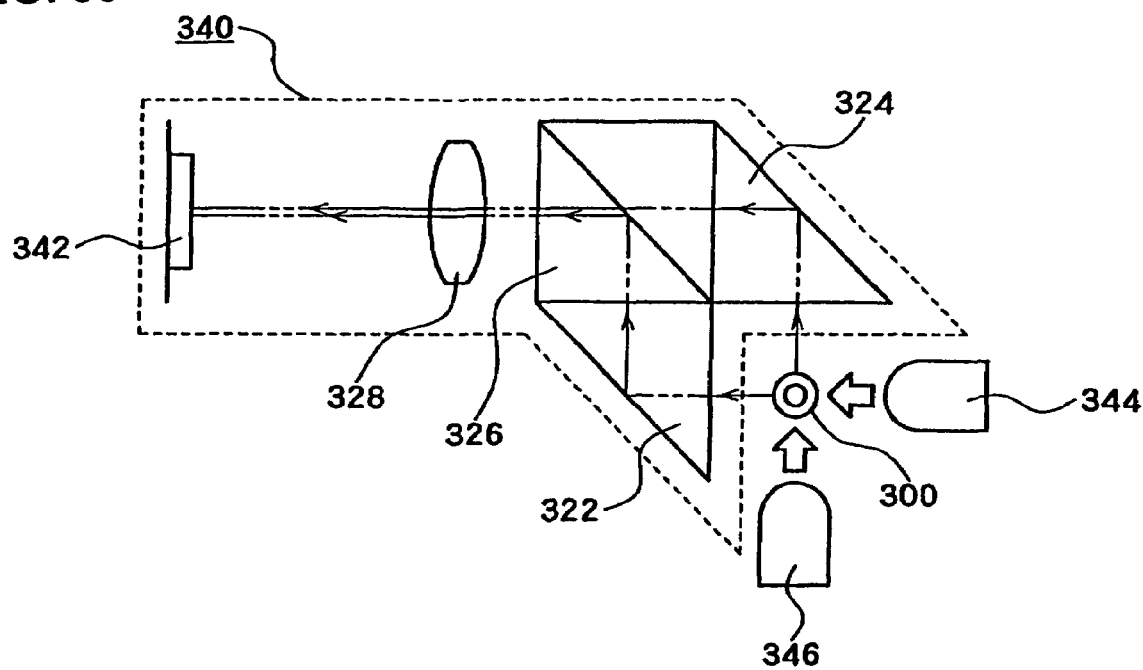
FIG. 35 is a diagram which illustrates the conditions of determination of the first positional deviation by a single correction camera in a seventh embodiment of the present invention.

In cases where the first positional deviation is determined by observing the target, etc., from the side-surfaces in two directions, the use of an appropriate optical part makes it possible to achieve this without using two correction cameras. For example, images of the side-surfaces of the target, etc., can be reflected using one or two reflective mirrors, so that the direction of the light path is altered, and so that these images are conducted to a single measuring device. FIGS. 33 and 34 show an example in which images of the target, etc., are conducted to the second camera 28 of the upper and lower camera unit using two reflective mirrors and one half-mirror, so that a correction camera is not needed. FIG. 35 shows an example in which the correction camera is constructed from a single camera.

FIG. 33 shows a state in which the upper and lower camera unit (not shown in the drawings) has been retracted and the bonding tool 12 or chip 10 has been lowered and caused to approach the tip end portion of the reference member 300 in order to determine the first deviation in a case where an optical part 320 that conducts an image of the reference member 300, etc., to the second camera 28 is used. Specifically, in this case, the chip 10 is moved to the height Z1. Furthermore, an optical part 320 which is used to conduct images of the side-surfaces of the reference member 300, bonding tool 12 and chip 10 seen from two directions is disposed between the reference member 300 and the second camera 28 of the upper and lower camera unit.

The optical part 320 comprises a first prism 322 which reflects an XZ plane image of the reference member 300 seen from a direction perpendicular to the XZ plane of the reference member 300 (i.e., from the direction of the Y axis), a second prism 324 which reflects a YZ plane image of the reference member 300 seen from a direction perpendicular to the YZ plane of the reference member 300 (i.e., from the direction of the X axis), and a half-mirror 326 which allows the light reflected by the first prism 322 to pass through, and which reflects the light reflected by the second prism 324, and conducts this light to a lens 328. The first prism 322 and second prism 324 may also be reflective mirrors.

The dispositions of the first prism 322, second prism 324 and half-mirror 326 are set so that the optical axis with respect to the XZ plane image and the optical axis with respect to the YZ plane image are coaxial, and so that the light is gathered by the lens 328. Furthermore, the light path lengths for the XZ plane image and YZ plane image are set so that these light path lengths are substantially the same. Specifically, the respective elements are disposed so that the light path length of the light path (reference member 300—first prism 322—semi-transmitting surface of the half-mirror 326) and the light path length of the light path (reference member 300—second prism 324—semi-transmitting surface of the half-mirror 326) are substantially the same. For example, as shown in FIG. 33, it is advisable that the angles of incidence and angles of reflection with respect to the reflective surface of the first prism 322, reflective surface of the second prism 324 and reflective surface of the half-mirror 326 be set at 45 degrees, and that the side-surface position of the reference member 300, the reflective position of the first prism 322, the reflective position of the second prism 324 and the reflective/transmitting position of the semi-transmitting surface of the half-mirror 326 be disposed in a square relationship.

The lens 328 is an optical element which has the function of arranging the incident light so that an image is focused at the focal position of the second camera 28. The focal position of the second camera 28 is ordinarily set at the height of the bonding execution surface; in the example shown in FIG. 33, this is set at more or less the height position of the tip end of the reference member 300. Accordingly, since the XZ plane image and YZ plane image passing through the optical part 320 cannot be observed in this state, an adjustment is performed by the lens 328.

The light path of the light that has passed through the lens 328 is altered using appropriate prisms 330 and 332, so that this light is conducted to the second camera 28. Thus, the light relating to the XZ plane image and light relating to the YZ plane image gathered by the lens 328 can be observed and imaged in a state in which this light is focused in the second camera 28.

In the second camera 28, the XZ plane image and YZ plane image may be simultaneously observed and imaged; however, it is desirable that the XZ plane image and YZ plane image be separately observed and imaged. Selection means for selecting the XZ plane image or YZ plane image can be provided for this purpose. For example, respective shutters may be installed in the light path for the XZ plane image and the light path for the YZ plane image, and the system may be devised so that only one of the two images is selectively conducted to the second camera 28. Furthermore, it is also possible to design the system so that the illumination of the reference member 300 can be independently controlled from two directions and to further design the system so that when the illumination from the direction of the Y axis is lit, the illumination from the direction of the X axis is extinguished so that only the light relating to the XZ plane image is conducted to the second camera 28, and conversely so that when the illumination from the direction of the Y axis is extinguished, the illumination from the direction of the X axis is lit so that only the light relating to the YZ plane image is conducted to the second camera 28. A difference may also be provided in the brightness values of the respective illuminations. Light-emitting diodes, etc., can be used for illumination. The system may also be devised so that the wavelengths of the respective illuminations are different, thus separating the XZ plane image and YZ plane image according to wavelength even in the case of simultaneous illumination from two directions.

FIG. 34 shows an example of the image data 334 of the second camera 28.

In this example, the XZ plane image has been selected and is indicated by a solid line; the YZ plane image that has not been selected is indicated by a broken line. In this way, the deviation $X_1$ between the reference position of the reference member and the reference position of the chip can be determined from the image data for the XZ plane image, and the deviation $Y_1$ between the reference position of the reference member and the reference position of the chip can be determined from the image data for the YZ plane image, by the same method as that illustrated in FIG. 31.

FIG. 35 is a top view layout diagram which shows the construction of the optical part, etc., used to conduct an image of the target, etc., to a single correction camera 340. The same symbols are assigned to elements that are the same as in FIG. 33.

The optical part in this case uses a layout similar to that of the first prism 322, second prism 324, half-mirror 326 and lens 328 in FIG. 33; an imaging element 342 is added to these elements, and the overall assembly is formed as a single correction camera 340. The lens 328 is disposed so that the incident light is focused as an image at the focal position of the imaging element 342. Furthermore, it is shown that LEDs (light-emitting diodes) 344 and 346 used for illumination are disposed on the side-surface side of the reference member 300. In such a construction, images of the target, etc., from two directions can be conducted to this single correction camera 340, so that image data similar to that illustrated in FIG. 34 can be obtained; furthermore, the first positional deviation $(X_1, Y_1)$ can be determined from this image data.

As seen from the above description, according to the present invention, the positioning mechanism that has the first camera and second camera further includes a target which has a position reference and a correction camera in order to correct the positional deviation; furthermore, a first positional deviation between the position reference of the target and the reference position of the object relating to the bonding tool, a second positional deviation between the position reference of the target and the imaging reference position of the second camera, and a third positional deviation between the reference position of the object relating to the bonding tool and the imaging reference position of the first camera, are determined. The first through third positional deviations correspond to $X_1$, $X_2$ and $X_3$ described in the principle of the present invention; accordingly, the positional deviation in bonding is determined based upon these values, and this positional deviation is corrected. Consequently, the positional deviation in bonding can be reduced even further.

Furthermore, according to the present invention, the first positional deviation is determined with the object relating to the bonding tool disposed at a height that is substantially the same as the height at which the substrate is disposed. Furthermore, according to the present invention, the target is disposed at a height that is substantially the same as the height at which the substrate is disposed. In this way, as described in the principle of the present invention, the correction amount $\Delta X=-Xc+Xn$ used in a case in which both a deviation $+Xn$ caused by the movement of the bonding tool in the height direction and a deviation $+Xc$ between the two cameras used for positioning exist is determined, and these deviations are corrected. Accordingly, the positional deviation in bonding can be reduced even further.

Furthermore, according to the present invention, a camera which has an object-side telecentric optical system is used as the correction camera. In a telecentric optical system, as described above, it is known that in particular, the size of the image, i.e., the distance from the optical axis, does not vary even if the object position fluctuates in the case of irradiation with transmitted light constituting parallel light. By using such a telecentric optical system, it is possible to perform imaging while causing almost no variation in the size of the image of the target or bonding tool, even if the position of the correction camera with respect to the height position of the substrate fluctuates, so that the first positional deviation can be determined more accurately.

Furthermore, according to the present invention, the positioning mechanism that has the first camera and second camera further includes a target which has a position reference, and an optical part which is disposed on one side of the target, and which conducts an image of the target to the second camera, in order to correct the positional deviation. Furthermore, a first positional deviation between the position reference of the target and the reference position of the object relating to the bonding tool, and a second positional deviation between the position reference of the target and the imaging reference position of the second camera, are determined based upon the image data of the second camera. Moreover, a third positional deviation between the reference position of the object relating to the bonding tool and the imaging reference position of the first camera is determined based upon the image data of the first camera. Since the first through third positional deviations correspond to $X_1$, $X_2$ and $X_3$ described in the principle of the present invention, the positional deviation in bonding is determined based upon these values, and is corrected. Accordingly, the positional deviation in bonding can be reduced even further. As a result of the above-described construction, the second camera can be used to determine the first positional deviation and second positional deviation; accordingly, the correction camera can be omitted, so that the construction of the bonding apparatus can be further simplified.

Furthermore, according to the present invention, the positioning mechanism that has the first camera and second camera includes a correction camera, and a first positional deviation between the imaging reference position of the correction camera and the reference position of the object relating to the bonding tool, a second positional deviation between the imaging reference position of the correction camera and the imaging reference position of the second camera, and a third positional deviation between the reference position of the object relating to the bonding tool and the imaging reference position of the first camera, are determined. Since the first through third positional deviations respectively correspond to $X_1$, $X_2$ and $X_3$ described in the principle of the present invention, the positional deviation in bonding is determined based upon these values, and this positional deviation is corrected. Accordingly, the positional deviation in bonding can be reduced even further. As a result of the above-described construction, the imaging center position of the correction camera is used as a position reference; accordingly, there is no need for the separate provision of a position reference such as a target or the like, and the construction of the bonding apparatus can therefore be simplified.

Furthermore, according to the present invention, the first camera and second camera are disposed on the same side of the target. Moreover, according to the present invention, a first camera and second camera which are disposed so that the object relating to the bonding tool and the substrate can be simultaneously observed are used. As a result, the movement of the first camera and second camera into the positions used to determine the correction amount for positioning is facilitated. For example, the first camera and second camera can be simultaneously moved into specified positions by a single operation. Accordingly, the construction and operation used to determine the positional deviation in bonding can be further simplified.

Furthermore, according to the present invention, a first camera and second camera which are disposed at a specified distance are used. As a result, the positional deviation in bonding can be corrected by using the principle of the present invention in a conventionally used bonding apparatus in which the bonding tool and second camera are disposed at a specified distance interval.

Furthermore, according to the present invention, the second camera is moved by a specified distance with respect to the target, and the variation in the position of the target in this case is determined from the image data of the second camera. Furthermore, the magnification of the second camera is calculated based upon (variation in the position of the target/specified amount of movement). Accordingly, the positional deviation in bonding can be accurately corrected.

Furthermore, according to the present invention, the object relating to the bonding tool is moved by a specified distance with respect to the correction camera, and the variation in the position of the object relating to the bonding tool in this case is determined from the image data of the correction camera. Furthermore, the magnification of the correction camera is calculated based upon (variation in the position of the bonding tool/specified amount of movement). Accordingly, the positional deviation in bonding can be accurately corrected.

Furthermore, according to the present invention, the object relating to the bonding tool is caused to face the correction camera, an the distance between two points on the object relating to the bonding tool is imaged; furthermore, the object relating to the bonding tool is caused to face the first camera, and the distance between the same two points on the object relating to the bonding tool is imaged. Moreover, the magnification of the first camera is calculated based upon (distance between the two points in the image data of the first camera)/(distance between the two points in the image data of the correction camera) and the magnification of the correction camera. Accordingly, the positional deviation in bonding can be accurately corrected.

Furthermore, according to the present invention, the second camera is moved in a specified direction with respect to the target, and the variation in the position of the target in this case is determined from the image data of the second camera. Furthermore, the inclination of the second camera is calculated based upon the difference between the angle of the direction of variation in the position of the target and the angle of a specified direction. Accordingly, the positional deviation in bonding can be accurately corrected.

Furthermore, according to the present invention, the object relating to the bonding tool is caused to face the correction camera, and an arbitrary shape on the object relating to the bonding tool and the target are imaged; moreover, the object relating to the bonding tool is caused to face the first camera, and the same shape on the object relating to the bonding tool is imaged. Furthermore, in the above-described construction, the inclination of the first camera with respect to the target is calculated based upon the inclination of an arbitrary shape with respect to the target, and the inclination of the first camera with respect to the same arbitrary shape. Accordingly, the positional deviation in bonding can be accurately corrected.

Furthermore, according to the present invention, the positioning mechanism that has the first camera and second camera further includes a target and a correction measurement device in order to correct the positional deviation; moreover, a first positional deviation between the position reference of the target and the reference position of the object relating to the bonding tool, a second positional deviation between the position reference of the target and the imaging reference position of the second camera, and a third positional deviation between the reference position of the object relating to the bonding tool and the imaging reference position of the first camera, are determined. Since the first through third positional deviations respectively correspond to $X_1$, $X_2$ and $X_3$ described in the principle of the present invention, the positional deviation in bonding is determined based upon these values, and this positional deviation is corrected. Accordingly, the positional deviation in bonding can be reduced even further.

Furthermore, according to the present invention, the positioning mechanism that has the first camera and second camera includes a target that can be observed from side-surface sides and upper-surface side thereof, and a correction camera that can respectively observe the side-surfaces of the target from two directions. Furthermore, a first positional deviation between the position reference of the target and the reference position of the object relating to the bonding tool is determined by observing the target and the object relating to the bonding tool from the side-surface of the target, and a second positional deviation between the position reference of the target and the imaging reference position of the of the second camera is determined by observing the target from the upper surface. Moreover, a third positional deviation between the reference position of the object relating to the bonding tool and the imaging reference position of the first camera is determined by observing the object relating to the bonding tool by means of the first camera. Since the first through third positional deviations respectively correspond to $X_1$, $X_2$ and $X_3$ described in the principle of the present invention, the positional deviation in bonding is determined based upon these values, and this positional deviation is corrected. Accordingly, the positional deviation in bonding can be reduced even further.

Furthermore, according to the present invention, the positioning mechanism that has the first camera and second camera further includes a target and an optical part which conducts an image of the target to the second camera in order to correct the positional deviation. Moreover, a first positional deviation between the position reference of the target and the reference position of the object relating to the bonding tool, and a second positional deviation between the position reference of the target and the imaging reference position of the second camera, are determined based upon the image data of the second camera. Furthermore, a third positional deviation between the reference position of the object relating to the bonding tool and the imaging reference position of the first camera is determined based upon the image data of the first camera. Since the first through third positional deviations respectively correspond to $X_1$, $X_2$ and $X_3$ described in the principle of the present invention, the positional deviation in bonding is determined based upon these values, and this positional deviation is corrected. Accordingly, the positional deviation in bonding can be reduced even further. As a result of the above-described construction, the second camera can be use to determine the first positional deviation and second positional deviation; accordingly, the construction of the bonding apparatus can be further simplified.

Furthermore, according to the present invention, the positioning mechanism that has the first camera and second camera further includes a target that can be observed from side-surface sides and upper-surface side thereof, and optical parts which are disposed on the side-surface side of the target, and which respectively conduct images of the side-surfaces of the target from two directions to the second camera. Furthermore, for the target and bonding tool, images that are observed from the side-surfaces of the target are imaged by the second camera via the optical part, and a first positional deviation between the position reference of the target and the reference position of the object relating to the bonding tool is determined. Moreover, the target is observed from the upper-surface by the second camera, and a second positional deviation between the position reference of the target and the imaging reference position of the second camera is determined. Moreover, the object relating to the bonding tool is observed by the first camera, and a third positional deviation between the reference position of the object relating to the bonding tool and the imaging reference position of the first camera is determined. Since the first through third positional deviations respectively correspond to $X_1$, $X_2$ and $X_3$ described in the principle of the present invention, the positional deviation in bonding is determined based upon these values, and this positional deviation is corrected. Accordingly, the positional deviation in bonding can be reduced even further. As a result of the above-described construction, the second camera can be used to determine the first positional deviation and second positional deviation; accordingly, the correction camera can be omitted, so that the construction of the bonding apparatus can be further simplified.

Furthermore, according to the present invention, the optical part includes two reflective means and a half-mirror; moreover, images of the side-surfaces of the target from two directions are formed with the same optical axis, and these images are conducted to the second camera with substantially the same light path lengths. Accordingly, images of the side-surfaces of the target from two directions can be observed with a comparable precision by one camera, so that the positional deviation in bonding can be corrected with good precision.

Thus, the bonding apparatus of the present invention makes it possible to achieve a further reduction in the positional deviation in bonding. In the bonding apparatus of the present invention, the amount of deviation caused by the movement of the bonding tool can be corrected along with the amount of deviation between the two cameras used for positioning when the chip and substrate used in bonding are positioned.

The invention claimed is:

1. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:
   a first camera that measures a position of an object relating to the bonding tool by way of taking at least one of the bonding tool, the object of bonding held in the bonding tool and a measurement member held in the bonding tool as said object relating to the bonding tool; and
   a second camera that measures a position of the substrate;
   wherein said positioning mechanism is further comprised of:
   a target which has a position reference and which can be observed from both sides thereof;
   a correction camera which is disposed on one side of the target;
   a first measurement means in which the object relating to the bonding tool is disposed on another side of the target in a predetermined positional relationship, the target and the object relating to the bonding tool are separately or simultaneously imaged by the correction camera, and a first positional deviation between the position reference of the target and a reference position of the object relating to the bonding tool is determined from image data of the correction camera;
   a second measurement means in which the second camera is disposed on another side of the target in a predetermined positional relationship, the target is imaged by the second camera, and a second positional deviation between the position reference of the target and an imaging reference position of the second camera is determined from image data of the second camera;
   a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and
   a calculating means which determines a positional deviation in bonding based upon the first positional deviation, second positional deviation and third positional deviation; and
   wherein the positional deviation in bonding is corrected based upon calculation results of the calculating means.

2. The bonding apparatus according to claim 1, wherein the first measurement means determines the first positional deviation with the object relating to the bonding tool disposed at a height that is substantially the same as the height at which the substrate is disposed.

3. The bonding apparatus according to claim 1 or 2, wherein the target is disposed at a height that is substantially the same as the height at which the substrate is disposed.

4. The bonding apparatus according to claim 1, wherein the correction camera has an object-side telecentric optical system.

5. The bonding apparatus according to claim 1, wherein the first camera and second camera of the positioning mechanism are disposed on the same side of the target.

6. The bonding apparatus according to claim 5, wherein the positioning mechanism has a first camera and second camera which are disposed so that the object relating to the bonding tool and the substrate can be simultaneously observed.

7. The bonding apparatus according to claim 1, wherein the bonding tool and second camera in the positioning mechanism are disposed at a specified distance from each other.

8. The bonding apparatus according to claim 1, further comprising a second camera magnification measurement means in which the second camera is disposed on another side of the target, the second camera is moved for a specified distance and a variation in the position of the target is imaged by the second camera, and a magnification of the second camera is determined from image data of the second camera based upon a variation in the position of the position reference of the target before and after the movement of the second camera.

9. The bonding apparatus according to claim 1, further comprising a correction camera magnification measurement means in which the object relating to the bonding tool is caused to face the correction camera, the object relating to the bonding tool is moved for a specified distance and the variation in the position of the object relating to the bonding tool is imaged by the correction camera, and the magnification of the correction camera is determined from image data of the correction camera based upon the variation in the position of the object relating to the bonding tool before and after the movement of the object relating to the bonding tool.

10. The bonding apparatus according to claim 9, further comprising:
   a means for measuring a distance between two points in which the object relating to the bonding tool is caused to face the correction camera, the distance between two arbitrary points set on the object relating to the bonding tool is imaged by the correction camera, and the distance between the arbitrary two points is determined from image data of the correction camera using the magnification of the correction camera; and
   a first camera magnification measurement means in which the first camera is caused to face the object relating to the bonding tool, the distance between the arbitrary two points set on the object relating to the bonding tool is imaged by the first camera, and the magnification of the first camera is determined based upon image data of the first camera and the distance between the arbitrary two points determined by the means for measuring a distance between two points.

11. The bonding apparatus according to claim 1, further comprising a second camera inclination measurement means in which the second camera is disposed on another side of the target, the second camera is moved in a specified direction and the variation in the position of the target is imaged, and an angle of inclination of the second camera with respect to the target is determined from image data of the second camera based upon the variation in the position reference of the target before and after the movement of the second camera.

12. The bonding apparatus according to claim 11, further comprising:

a shape inclination measurement means in which the object relating to the bonding tool is caused to face the correction camera, the target and an arbitrary shape set on the object relating to the bonding tool are imaged by the correction camera, and an angle of inclination of the arbitrary shape with respect to the target is determined from image data of the correction camera; and a first camera inclination measurement means in which the first camera is caused to face the object relating to the bonding tool, the arbitrary shape set on the object relating to the bonding tool is imaged by the first camera, and an angle of inclination of the first camera with respect to the target is determined based upon image data of the first camera and an inclination of the arbitrary shape determined by the shape inclination measurement means.

13. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:

a first camera that measures a position of an object relating to the bonding tool by way of taking at least one of the bonding tool, the object of bonding held in the bonding tool and a measurement member held in the bonding tool as said object relating to the bonding tool; and a second camera that measures a position of the substrate;

wherein said positioning mechanism is further comprised of:

a target which has-a position reference and which can be observed from both sides;

an optical part which is disposed on one side of the target and conducts an image of the target to the second camera;

a first measurement means in which the object relating to the bonding tool is disposed on another side of the target in a predetermined positional relationship, an image of the target conducted via the optical part and an image of the object relating to the bonding tool are separately or simultaneously acquired by the second camera, and a first positional deviation between the position reference of the target and a reference position of the object relating to the bonding tool is determined from image data of the second camera;

a second measurement means in which the second camera is disposed on another side of the target in a predetermined positional relationship, the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and wherein the positional deviation in bonding is corrected based upon calculation results of the calculating means.

14. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:

a first camera that measures a position of an object relating to the bonding tool by way of taking at least one of the bonding tool, the object of bonding held in the bonding tool and a measurement member held in the bonding tool as said object relating to the bonding tool; and a second camera that measures a position of the substrate;

wherein said positioning mechanism is further comprised of:

a correction camera;

a first measurement means in which the object relating to the bonding tool is caused to face the correction camera in a predetermined positional relationship, the object relating to the bonding tool is imaged by the correction camera, and a first positional deviation between an imaging reference position of the correction camera and a reference position of the object relating to the bonding tool is determined from image data of the correction camera;

a second measurement means in which the second camera is caused to face the correction camera in a predetermined positional relationship, the imaging plane of the second camera is imaged by the correction camera, and a second positional deviation between the imaging reference position of the correction camera and an imaging reference position of the second camera is determined from image data of the correction camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and the imaging reference position of the first camera is determined from image data of the first camera; and a calculating means which determines a positional deviation in bonding based upon the first positional deviation, second positional deviation and third positional deviation; and wherein the positional deviation in bonding is corrected based upon calculation results of the calculating means.

15. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:

a first camera that measures a position of an object relating to the bonding tool by way of taking at least one of the bonding tool, the object of bonding held in the bonding tool and a measurement member held in the bonding tool as said object relating to the bonding tool; and a second camera that measures a position of the substrate;

wherein said positioning mechanism is further comprised of:

a target;

a correction measurement device;

a first measurement means in which the target and the object relating to the bonding tool are separately or simultaneously measured by the correction measurement device, and a first positional deviation between a position reference of the target and a reference position of the object relating to the bonding tool is determined from the measurement data;

a second measurement means in which the target is imaged by the second camera, and a second positional deviation between the position reference of the target and an imaging reference position of the second camera is determined from image data of the second camera;

a third measurement means in which the object relating to the bonding tool is imaged by the first camera, and a third positional deviation between the reference position of the object relating to the bonding tool and an imaging reference position of the first camera is determined form the image data of the first camera; and a calculating means which determines a positional deviation in bonding based upon the first positional deviation, second positional deviation and third positional deviation; and wherein the positional deviation in bonding is corrected based upon calculation results of the calculating means.

16. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:

a first camera that measures a position of an object relating to the bonding tool by way of taking at least one of the bonding tool, the object of bonding held in the bonding tool and a measurement member held in the bonding tool as said object relating to the bonding tool; and a second camera that measures a position of the substrate;

wherein said positioning mechanism is further comprised of:

a target that can be observed from side-surface sides and upper-surface side thereof;

at least one correction camera which is disposed so that the side-surfaces of the target can be respectively observed from two directions;

a first measurement means in which the object relating to the bonding tool is disposed on upper-surface side of the target in a predetermined positional relationship, the target and the object relating to the bonding tool are separately or simultaneously imaged by the correction camera, and a first positional deviation between a position reference of the target and a reference position of the object relating to the bonding tool is determined from image data of the correction camera;

a second measurement means in which the second camera is disposed on an upper-surface side of the target in a predetermined positional relationship, the upper-surface of the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and wherein the positional deviation in bonding is corrected based upon calculation results of the calculating means.

17. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:

a first camera that measures a position of an object relating to the bonding tool by way of taking at least one of the bonding tool, the object of bonding held in the bonding tool and a measurement member held in the bonding tool as said object relating to the bonding tool; and a second camera that measures a position of the substrate;

wherein said positioning mechanism is further comprised of:

a target;

an optical part which conducts an image of the target to the second camera;

a first measurement means in which an image of the target conducted via the optical part and an image of the object relating to the bonding tool are separately or simultaneously imaged by the second camera, and a first positional deviation between a position reference of the target and a reference position of the object relating to the bonding tool is determined from image data of the second camera;

a second measurement means in which the target is imaged by the second camera, and a second positional deviation between the position reference of the target and an imaging reference position of the second camera is determined from image data of the second camera;

a third measurement means in which the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and wherein the positional deviation in bonding is corrected based upon calculation results of the calculating means.

18. A bonding apparatus including a positioning mechanism that performs bonding by positioning by said positioning mechanism an object of bonding, which is held in a bonding tool, in a determined position of a substrate disposed on a bonding execution surface, said positioning mechanism being comprised of:

a first camera that measures a position of an object relating to the bonding tool by way of taking at least one of the bonding tool, the object of bonding held in the bonding tool and a measurement member held in the bonding tool as said object relating to the bonding tool; and a second camera that measures a position of the substrate;

wherein said positioning mechanism is further comprised of:

a target that can be observed from side-surface sides and an upper-surface side thereof;

optical parts which are disposed on side-surface sides of the target and which respectively conduct images of side-surfaces of the target from two directions to the second camera;

a first measurement means in which the object relating to the bonding tool is disposed on another side of the target in a predetermined positional relationship, images of the target conducted via the optical parts and an image of the object relating to the bonding tool are separately or simultaneously acquired by the second camera, and a first positional deviation between a position reference of the target and a reference position of the object relating to the bonding tool is determined from image data of the second camera;

a second measurement means in which the second camera is disposed on an upper-surface side of the target in a predetermined positional relationship, the upper-surface of the target is imaged by the second camera, and a second positional deviation between the position reference of the target and an imaging reference position of the second camera is determined from image data of the second camera;

a third measurement means in which the first camera is caused to face the object relating to the bonding tool in a predetermined positional relationship, the object relating to the bonding tool is imaged by the first camera, and a third positional deviation between the reference position of the object relating to the bonding tool and an imaging reference position of the first camera is determined from image data of the first camera; and a calculating means which determines a positional deviation in bonding based upon the first positional deviation, second positional deviation and third positional deviation; and wherein the positional deviation in bonding is corrected based upon calculation results of the calculating means.

19. The bonding apparatus according to claim 18, wherein the optical part is comprised of:

a first reflective means which reflects an image of the side-surface of the target from a first direction;

a second reflective means which reflects an image of the side-surface of the target from the second direction; and a half-mirror which has both a reflective surface and a transmitting surface and which further reflects an image from the first reflective means by the reflective surface and transmits an image from the second reflective means by the transmitting surface; and wherein the first reflective means, second reflective means and half-mirror are disposed so that the optical axis of the reflected light following reflection and the optical axis of the transmitted light following transmission in the half-mirror are coaxial, and so that the length of the light path from the target to the reflective surface of the half-mirror for the image of the side-surface of the target from the first direction and the length of the light path from the target to the transmitting surface of the half-mirror for the image of the side-surface of the target from the second direction are substantially equal.

* * * * *